US011849536B1

(12) United States Patent
Ingalz et al.

(10) Patent No.: US 11,849,536 B1
(45) Date of Patent: Dec. 19, 2023

(54) GANTRY FOR THERMAL MANAGEMENT

(71) Applicant: Lunar Energy, Inc., Mountain View, CA (US)

(72) Inventors: Charles Ingalz, San Jose, CA (US); Christopher McCarthy, San Mateo, CA (US); Aaron Nealy, San Jose, CA (US); Wendy Trattner, San Francisco, CA (US); Peter H. J. How, Mililani, HI (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 17/964,504

(22) Filed: Oct. 12, 2022

(51) Int. Cl.
*H05K 7/14* (2006.01)
*H05K 1/02* (2006.01)

(52) U.S. Cl.
CPC .......... *H05K 1/021* (2013.01); *H05K 7/1428* (2013.01); *H05K 2201/10265* (2013.01); *H05K 2201/10318* (2013.01)

(58) Field of Classification Search
None
See application file for complete search history.

(56) References Cited

U.S. PATENT DOCUMENTS

| 4,103,321 A | | 7/1978 | Gansert |
| 5,060,112 A | | 10/1991 | Cocconi |
| 5,251,098 A | * | 10/1993 | Schmidt ............. H01L 23/4006 174/16.3 |
| 5,428,504 A | | 6/1995 | Bhatla |
| 5,646,826 A | * | 7/1997 | Katchmar .......... H05K 7/20463 257/E23.09 |
| 5,909,358 A | | 6/1999 | Bradt |
| 6,088,226 A | * | 7/2000 | Rearick .............. H01L 23/4006 361/717 |
| 6,122,170 A | | 9/2000 | Hirose |
| 6,424,528 B1 | * | 7/2002 | Chao .................... H01L 23/427 165/104.33 |
| 6,566,879 B1 | | 5/2003 | Vanek |
| 6,714,414 B1 | * | 3/2004 | Dubovsky .......... H01L 23/4006 257/722 |

(Continued)

FOREIGN PATENT DOCUMENTS

| CN | 204442152 | 7/2015 |
| CN | 218071294 | 12/2022 |

OTHER PUBLICATIONS

"Automotive-grade silicon carbide Power MOSFET 1200 V, 9.3 mΩ typ., 170 A in a STPAK package", Datasheet, STMicroelectronics, Oct. 2022.

(Continued)

*Primary Examiner* — Courtney L Smith
(74) *Attorney, Agent, or Firm* — Van Pelt, Yi & James LLP

(57) ABSTRACT

A gantry for thermal management is disclosed, including: a heat generating component that includes a top surface and a bottom surface; a heat sink; a thermally conductive and electrically insulating material that is in direct contact with the heat sink; and a gantry extending above the heat generating component, wherein the gantry pushes a pin against the top surface of the heat generating component such that the bottom surface of the heat generating component is pushed against the thermally conductive and electrically insulating material.

23 Claims, 21 Drawing Sheets

(56) References Cited

U.S. PATENT DOCUMENTS

| | | | | |
|---|---|---|---|---|
| 7,746,653 | B2* | 6/2010 | Negrut | H01L 23/4006 |
| | | | | 165/185 |
| 8,120,171 | B2* | 2/2012 | Koike | H01L 24/72 |
| | | | | 174/16.3 |
| 9,253,871 | B2* | 2/2016 | Kim | H05K 7/1461 |
| 9,322,580 | B2* | 4/2016 | Hershberger | H10N 10/13 |
| 10,312,177 | B2 | 6/2019 | Zhang | |
| 11,063,495 | B2* | 7/2021 | Skinner | H05K 7/20145 |
| 11,105,567 | B2 | 8/2021 | Fan | |
| 11,533,805 | B2* | 12/2022 | Luu | H05K 1/0209 |
| 11,547,024 | B2* | 1/2023 | Rai | H02M 7/003 |
| 2002/0026996 | A1 | 3/2002 | Krieger | |
| 2003/0150605 | A1 | 8/2003 | Belady | |
| 2004/0188062 | A1 | 9/2004 | Belady | |
| 2005/0264998 | A1* | 12/2005 | McCutcheon | H01L 23/4006 |
| | | | | 257/E23.084 |
| 2010/0319898 | A1 | 12/2010 | Underwood | |
| 2012/0320544 | A1 | 12/2012 | Ohhashi | |
| 2015/0016783 | A1 | 1/2015 | Leigh | |
| 2016/0211191 | A1 | 7/2016 | Tan | |
| 2016/0233597 | A1 | 8/2016 | Binder | |
| 2016/0315030 | A1 | 10/2016 | Strader | |
| 2019/0014689 | A1 | 1/2019 | Yu | |
| 2019/0380220 | A1 | 12/2019 | Matsuda | |
| 2020/0267867 | A1 | 8/2020 | Chen | |
| 2022/0338390 | A1 | 10/2022 | She | |

OTHER PUBLICATIONS

"Automotive-grade silicon carbide Power MOSFET 750 V, 6.5 mΩ typ., 300 A in a STPAK package", Datasheet, STMicroelectronics, Oct. 2022.

Elena Barbarini, "Reverse Costing ©—Structural, Process & Cost Report", Power Semiconductor report, SystemPlus Consulting, Version 1, Jun. 2018.

* cited by examiner

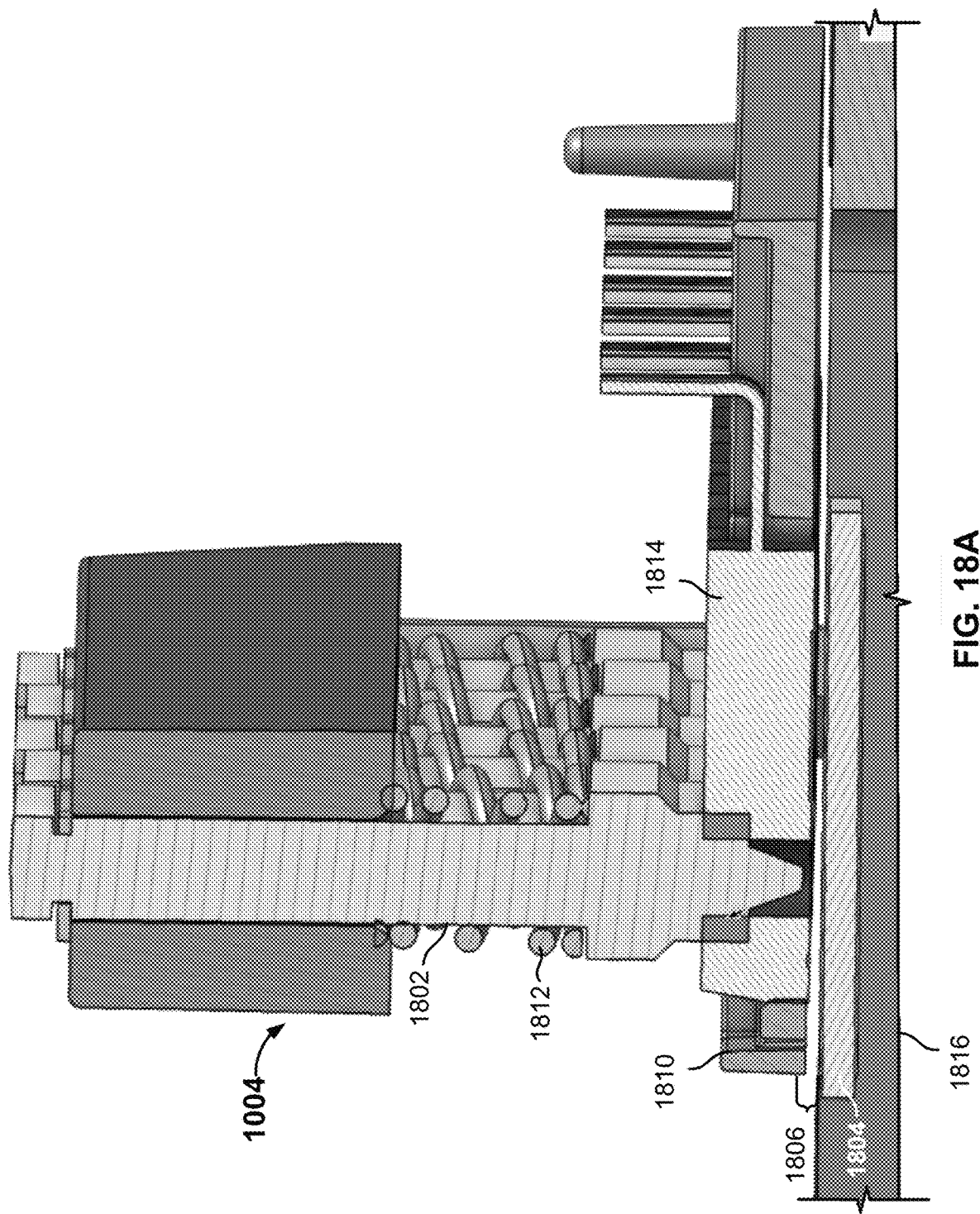

GANTRY FOR THERMAL MANAGEMENT

BACKGROUND OF THE INVENTION

Electrical devices include components that generate considerable heat. However, too much heat could create safety concerns as well as degrade the performance of certain components within the electronic device. It would be desirable to manage the heat generated by certain electrical components within an electrical device while maintaining electrical insulation to prevent any unwanted current flow. Furthermore, it would be desirable to provide an enclosed environment for sensitive electrical components in an electrical device so as to keep out foreign contaminants/pollutants.

BRIEF DESCRIPTION OF THE DRAWINGS

Various embodiments of the invention are disclosed in the following detailed description and the accompanying drawings.

FIG. 18A is a diagram showing a cross-section of an arrangement of a gantry assembly and transistors before the gantry is fastened into the heat sink.

DETAILED DESCRIPTION

Figure 1:
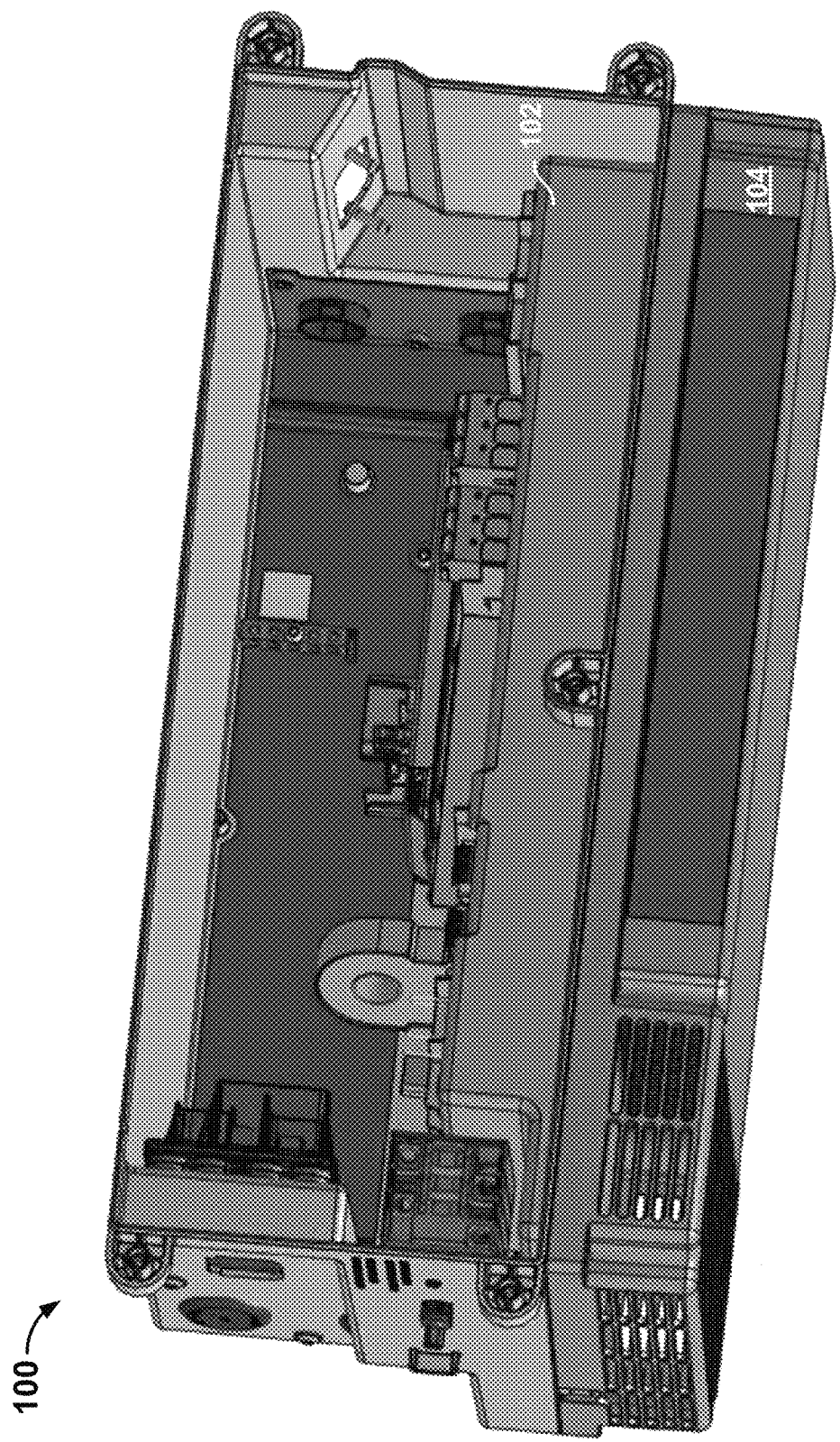
FIG. 1 is a diagram showing an embodiment of an inverter device with one side open.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of a cover for sealing a module are described herein. In various embodiments, the cover is configured to seal a power module. In some embodiments, the power module is located inside an inverter device and includes one or more circuit boards. In some embodiments, at least one circuit board includes switch components that are configured to perform, at least in part, the primary function of the inverter device, which is to convert direct current (DC) to alternating current (AC) (or vice versa, depending on the configuration). The cover comprises a first gasket that is placed along a (e.g., edge) portion of the cover that is to join with a heat sink. The cover also includes a fastener that is to engage with the heat sink. In some embodiments, the heat sink comprises a metallic structure that is coupled to at least one of the circuit boards that is to be completely or in part, sealed by the cover from the internal environment of the inverter device. The heat sink is configured to draw heat away from heat generating components (e.g., transistors, inductors) that are soldered onto the circuit board(s). The cover further comprises a second gasket that is placed around an exposure area of the cover. The cover is configured to couple to a circuit board of the power module and the cover is configured to enclose the portions of the coupled circuit board other than those that are exposed by the exposure area(s) of the cover. For example, a sensitive electrical component of the circuit board can be enclosed within the sealed cover while a connector on the same circuit board to another component outside of the power module can be left exposed by a cutout/exposure region of the cover. As a result of the sealing provided by the cover, the environment within the sealed cover provides an enclosed environment with a higher ingress protection (IP) rating than an environment that is external to the sealed power module.

Embodiments of a thermal management system are described herein. In various embodiments, a power module (e.g., that is sealed by the cover described above) inside an inverter device includes a set of at least one heat generating component for which the heat from their bottom surface(s) are to be transferred to a heat sink below. A thermally conductive and electrically insulating material is in direct contact with the heat sink. In some embodiments, the thermally conductive and electrically insulating material is placed into a cavity of substantially similar dimensions in the heat sink. A gantry extends above the heat generating component(s) and holds spring-loaded pins against the top surface(s) of the heat generating component(s) such that the bottom surface(s) of the heat generating component(s) are secured (e.g., flush) against the thermally conductive and electrically insulating material to better transfer heat towards the heat sink.

Embodiments of a thermal interface sandwich are described herein. A thermal interface sandwich is configured to be thermally conductive and electrically insulating so that it can be used with a heat sink to draw heat away from an electrical component (e.g., a transistor) that generates heat and, optionally, includes an active voltage. The thermal interface sandwich comprises a thermally conductive solid that includes a top surface and a bottom surface. The thermal interface sandwich further includes a first thermal interface that is applied to the top surface of the thermally conductive solid. The thermal interface sandwich further includes a second thermal interface that is applied to the top surface of the thermally conductive solid. For example, the thermal interface sandwich can be placed into a cavity of the heat sink and also placed below heat generating components (e.g., that are part of a circuit board that is part of an inverter device's power module) so as to draw heat away from the heat generating components and to be dissipated by the heat sink.

FIG. 1 is a diagram showing an embodiment of an inverter device with one side open. Inverter device 100 is an enclosed inverter device that is configured to convert input direct current (DC) (e.g., which is received from solar panels or a battery) into alternating current (AC), which is then output to power, for example, home appliances. As shown in FIG. 1, inverter device 100 has one side/panel removed so that FIG. 1 can show the components, such as sealed power module 102, inside the internal environment of inverter device 100. As will be described in further detail below, sealed power module 102 includes one or more circuit boards with sensitive electrical components that are configured to perform the conversion of input DC to output AC. Sealed power module 102 sits above and is also joined to a heat sink, which is obscured by housing 104 of inverter device 100. The heat sink, as will be described in further detail below, is coupled to the one or more circuit boards that are enclosed by sealed power module 102 and is configured to draw heat generated by one or more electrical components (e.g., inductors and transistors) that are part of the circuit board(s). FIG. 1 shows inverter device 100 in a position that is inverted from the one in which inverter device 100 can be installed.

Figure 2:
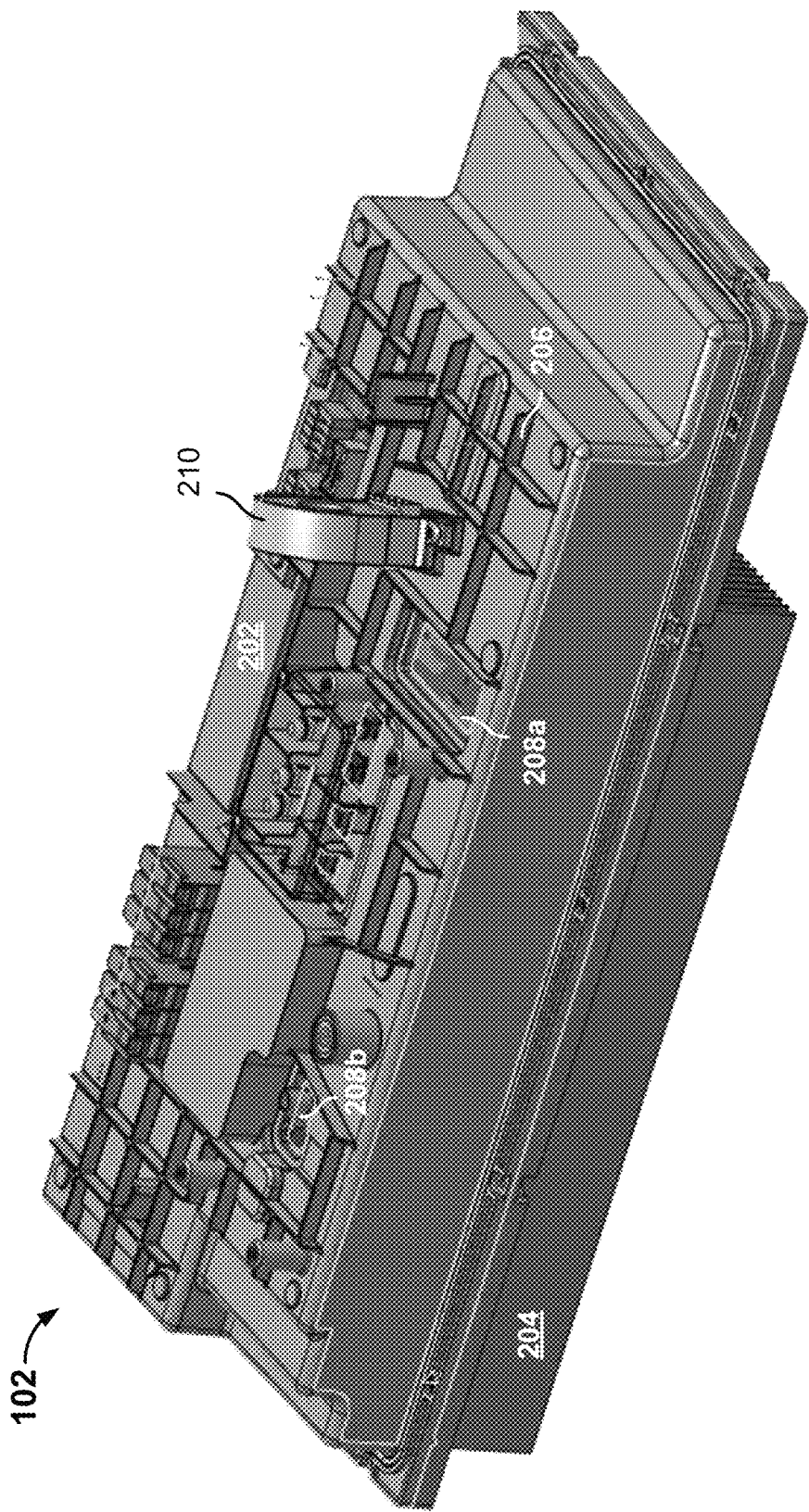
FIG. 2 is a diagram showing an example of a sealed power module.

FIG. 2 is a diagram showing an example of a sealed power module. In some embodiments, sealed power module 102 of inverter device 100 of FIG. 1 can be implemented using the example sealed power module that is shown in FIG. 2. The sealed power module includes cover 202 that is configured to join with heat sink 204, which is located below cover 202 as shown in FIG. 2. In various embodiments, heat sink 204 is made of metal (e.g., aluminum). As will be described in further detail below, in some embodiments, cover 202 is joined to heat sink 204 by fasteners that extend from the edges of cover 202 and that engage into receiving holes of the edges of heat sink 204. Furthermore, cover 202 provides a secure seal of the enclosed and covered electrical components due to gaskets (e.g., made of elastomer material) (not shown in FIG. 2) that are placed along the edges of cover 202, which comes into contact with the edges of heat sink 204, when cover 202 is joined with heat sink 204. As mentioned above, heat sink 204 is coupled to one or more circuit boards that are covered by cover 202. As shown in FIG. 2, cover 202 includes one or more cutout regions (e.g., 208a and 208b) that allow the exposure of corresponding regions of an otherwise covered circuit board. As will be described in further detail below, regions of the otherwise covered circuit board that are exposed by the cutout region(s) of cover 202 may include components (e.g., connectors) that are configured to connect to other components within or external to the internal environment of the inverter box. While not shown in FIG. 2, each cutout region of cover 202 is encircled with a gasket that is in contact with the circuit board for which a corresponding region is to be exposed to the exterior of cover 202. By disposing gaskets on regions of cover 202 that are in contact with either heat sink 204 or a covered circuit board, other than the regions of the circuit board that are intentionally exposed via the cutout regions of cover 202, all other components of the enclosed circuit boards are maintained in a securely sealed environment.

Due to the strong seal that is offered by the gaskets and fasteners of cover 202, the IP rating (protection against foreign contaminants) of the enclosed environment (that includes the circuit boards) is greater (stronger) than the IP rating of the environment that is exterior to cover 202, such as the internal environment of the inverter device. For example, the IP rating of the enclosed environment within cover 202 is around IP 67 (e.g., which can keep out dust and withstand immersion water for a finite time period) while the IP rating of the internal environment of the inverter device that is outside of the enclosure of cover 202 is IP 56 (e.g., which can keep out some dust and protect against projection of water).

Cover 202 also includes grid-like stiffening features (e.g., feature 206) on the surface that are exterior to the enclosed circuit boards to protect cover 202 from being easily dented by impact. Additional components (e.g., component 210) can also be mounted to this external surface of cover 202 via fasteners that do not pass through the thickness of cover 202.

Figure 3:
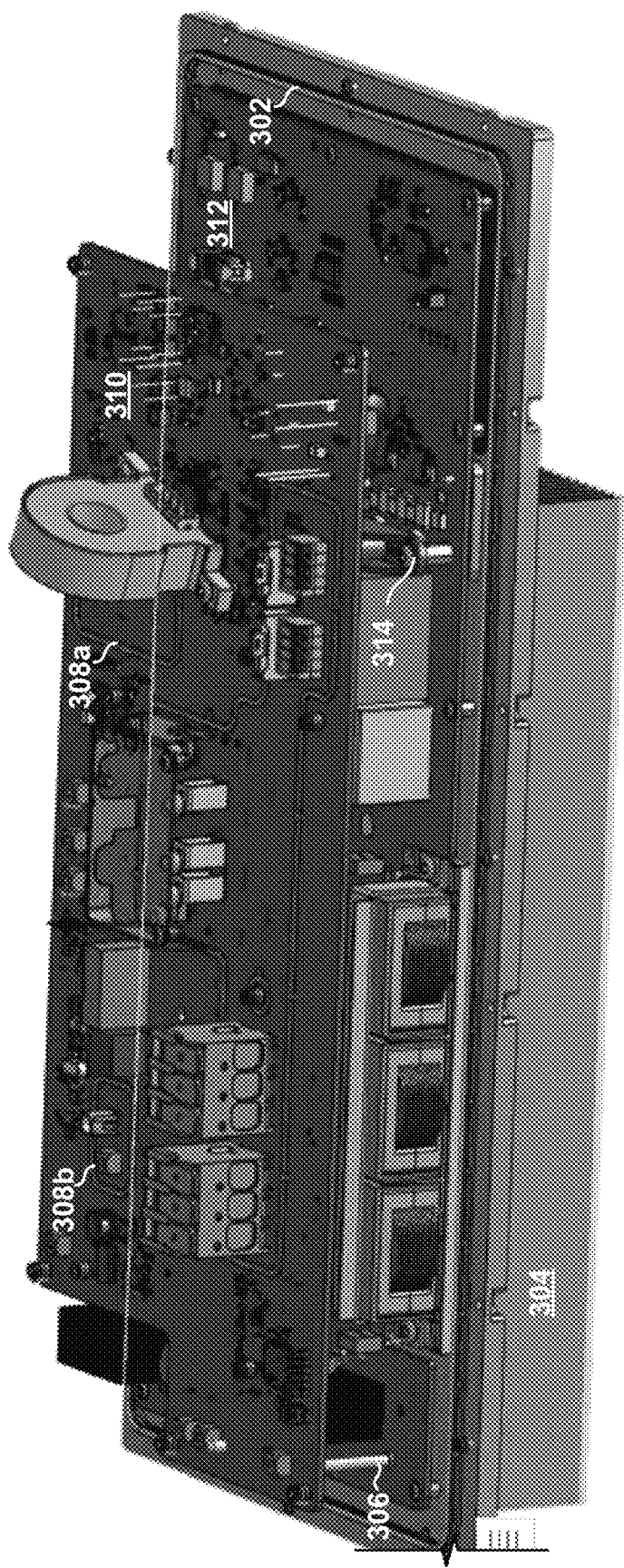
FIG. 3 is a diagram showing an example of an uncovered power module.

FIG. 3 is a diagram showing an example of an uncovered power module. In some embodiments, stacked circuit boards 310 and 312 of FIG. 3 are the circuit boards that are enclosed by cover 202 that is shown in FIG. 2. Circuit board 312, which is sometimes referred to as a "power circuit board" or "power board," includes electrical components such as, capacitors, inductors, transistors for switching, and driver circuitry for the transistors that are configured to take input DC and generate AC as an output (or vice versa based on the configuration). Circuit board 310, which is sometimes referred to as a "terminal circuit board" or "terminal board," includes communications components, connectors, a power supply to a home controller (not shown), and terminals (e.g., the AC terminal, the photovoltaic terminal). In the example of FIG. 3, circuit board 312 is coupled to circuit board 310 via blind mates such as blind mate connector pin 306, which is a pin that engages with and aligns both circuit boards in a space efficient way (e.g., without using any cabling). At least some electrical components (e.g., the inductors and the transistors) of circuit board 312, which is the board that is closer to heat sink 304, generate significant heat and whose heat is therefore connected to heat sink 304 in a manner that is thermally conductive and electrically insulating so that heat sink 304 can transfer and dissipate the heat via its many surfaces (e.g., via its fins). Gantry assembly 314 that extends out of heat sink 304 and over circuit board 312 engages with one or more transistors (not shown in FIG. 3) to secure them against heat sink 304 in a thermally conductive and electrically insulating manner, as will be described in further detail below.

While the cover (e.g., cover 202 of FIG. 2) that is to join with heat sink 304 and to enclose circuit boards 310 and 312 is not shown in FIG. 3, FIG. 3 does show the gaskets that are disposed on the cover and that are to contact with heat sink 304 and circuit board 310 when the cover is joined with heat sink 304. In particular, gasket 302 is to be placed around the edge of the cover and is to contact the edge of heat sink 304 and thereby provide a seal along the area in which the two pieces meet. Furthermore, gaskets 308a and 308b are placed around the cutout regions (e.g., cutout regions 208a and 208b of FIG. 2) of the cover and are to contact circuit board 310 at the boundaries of two corresponding exposed regions and thereby provide a seal around those exposed regions. In some embodiments, gaskets 308a and 308b sit in corresponding grooves of the internal surface of the cover.

Figure 4:
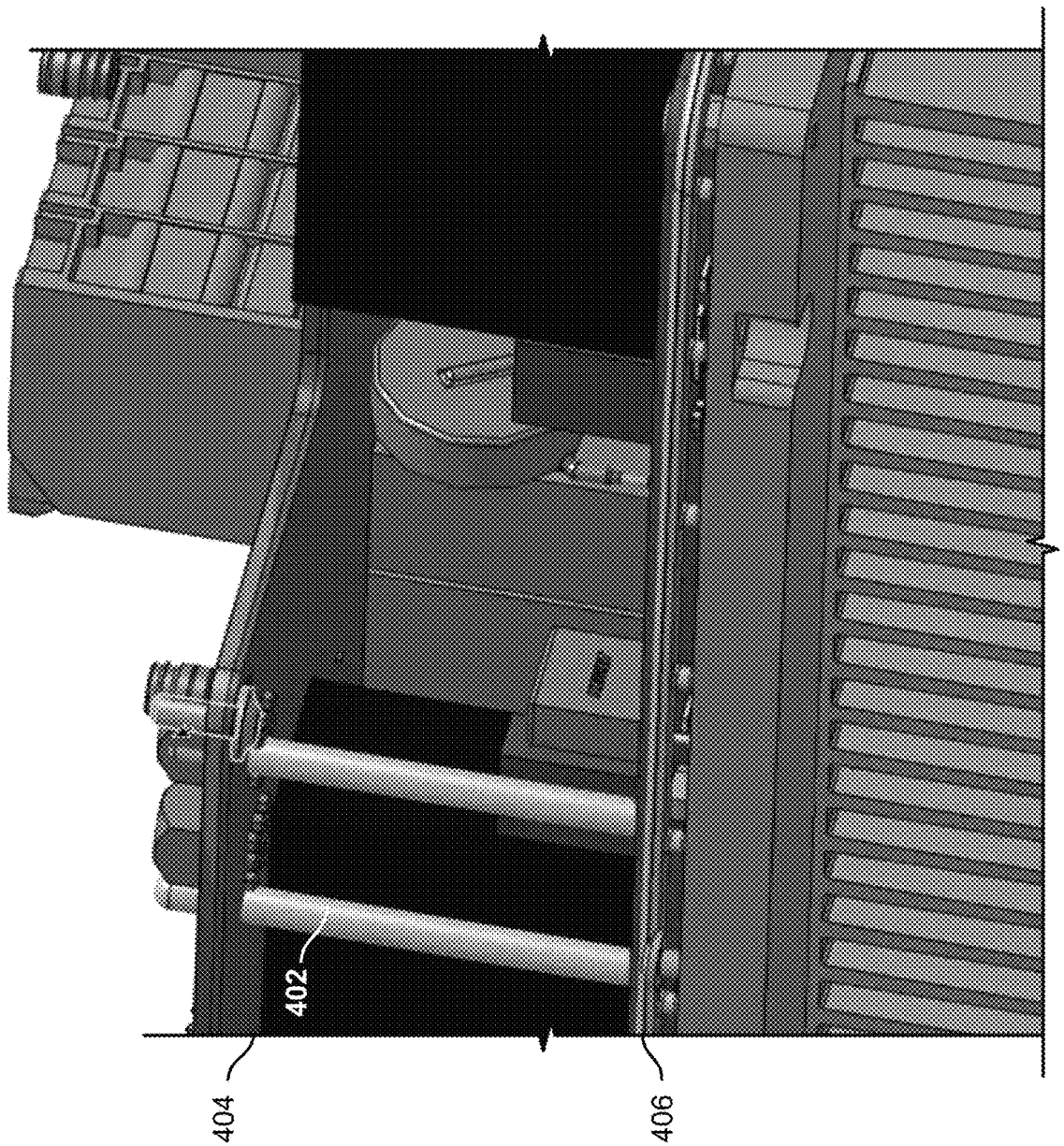
FIG. 4 is a diagram showing example blind mate connector pins that can be used to couple a power board to a terminal board, one on top of the other.

FIG. 4 is a diagram showing example blind mate connector pins that can be used to couple a power board to a terminal board, one on top of the other. In some embodiments, circuit board 310 (terminal board) of FIG. 3 can be coupled to circuit board 312 (power board) of FIG. 3 using blind mate connector pins 402 that are shown in FIG. 4. In FIG. 4, blind mate connector pins couple terminal board 404 to power board 406. Some advantages of using blind mate connectors are that they are self-aligning and also provide electrical signals without mechanical cables. For example, a blind mate connector pin can engage at each end with a corresponding receiving feature located on each of the two circuit boards.

Figure 5:
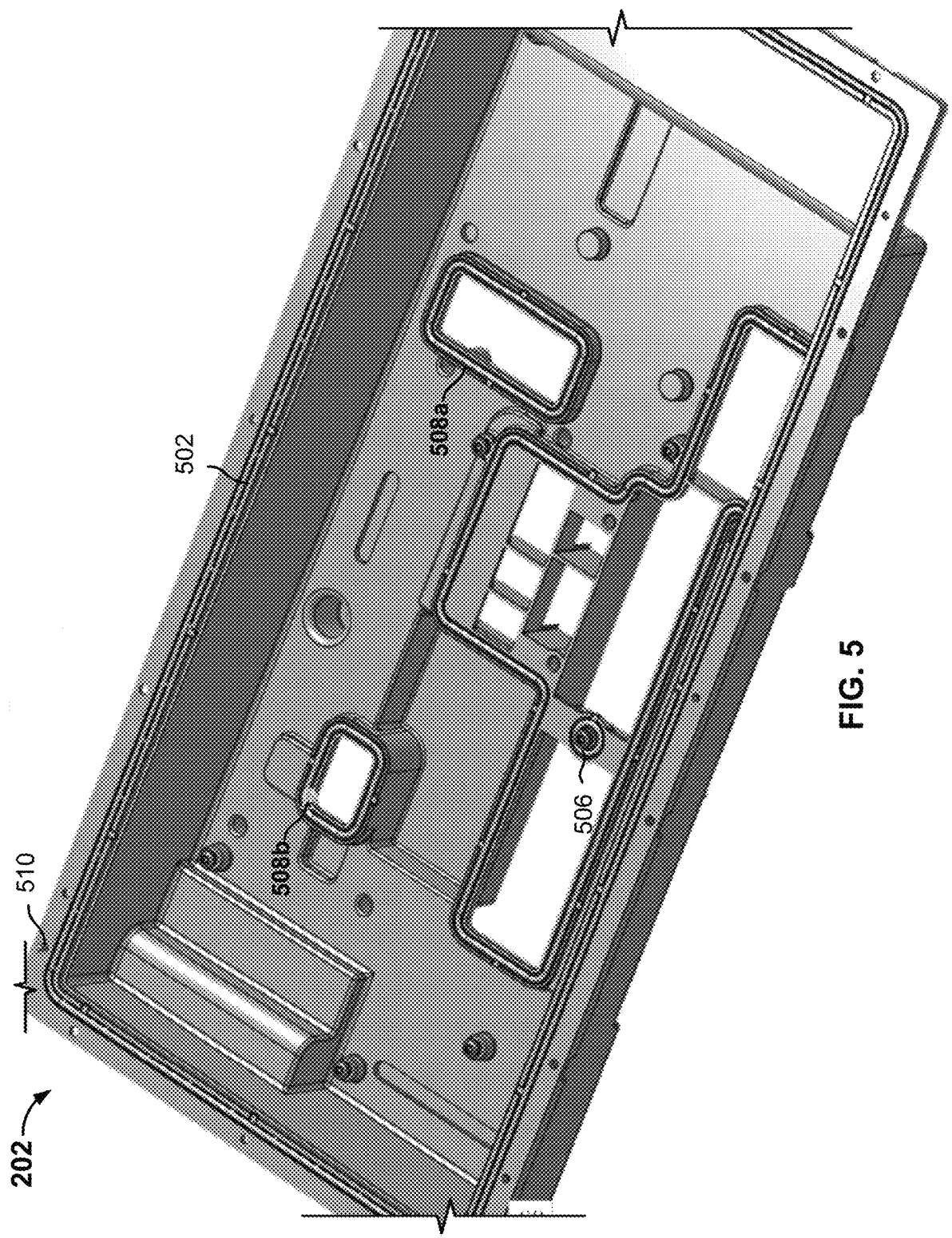
FIG. 5 is a diagram showing an example of a cover to a power module.

FIG. 5 is a diagram showing an example of a cover to a power module. In some embodiments, the example cover shown in FIG. 5 is the view of the underside (internal surface) of cover 202 of FIG. 2 that is to join with a heat sink (not shown) and enclose a power module (e.g., including one or more circuit boards). Put another way, the underside of cover 202 includes the internal surface of cover 202 that is to be in contact with the heat sink and the (e.g., terminal) circuit board (e.g., circuit board 310 of FIG. 3) that are to be sealed off from the internal environment of the inverter box by cover 202. As mentioned above, the edge of the cover is lined with a gasket (gasket 502) and is to join with a heat sink and therefore provide a seal at the joining. For example, engagement feature 510 that extends from the edge of the underside of the cover can engage with a corresponding receiving hole in the heat sink. Also, as mentioned above, the cutout regions of the cover are fitted with corresponding gaskets such as gaskets 508a and 508b so that the gaskets seal off the areas of the (e.g., terminal) circuit board that are not exposed to the internal environment of the inverter device through the cutout regions of the cover. The underside of the cover also includes fasteners, such as fastener 506, that couple with receiving features of the (e.g., terminal) circuit board. In some embodiments, the fasteners of the cover that couple with the receiving features of the (e.g., terminal) circuit board are located entirely within the enclosed/sealed side of the cover and are therefore concealed/not exposed to the internal environment of the inverter device and therefore, do not provide more openings that also need to be sealed off. As shown in FIG. 5, at least some of the fasteners located on the underside of the cover can also be ringed with a corresponding gasket. At least some of the fasteners on the internal surface of the cover are located near the gaskets around the cutout regions of the cover to provide an even tighter seal by tightly coupling with the (e.g., terminal) circuit board around the exposed regions of the circuit board. As mentioned above, due to the fasteners (e.g., 506) and the gaskets (e.g., 502, 508a, and 508b) that are placed on the internal surface/underside of the cover, when joined with the heat sink, the cover can provide a strongly sealed environment with a first IP rating (e.g., 62-67) over the enclosed portions of the circuit board(s) but also selectively expose certain regions of the (e.g., terminal) circuit board that need to be connected to components outside of the enclosed areas of the power module to the internal inverter environment, which has a lower IP rating (e.g., IP 51-56).

Figure 6:
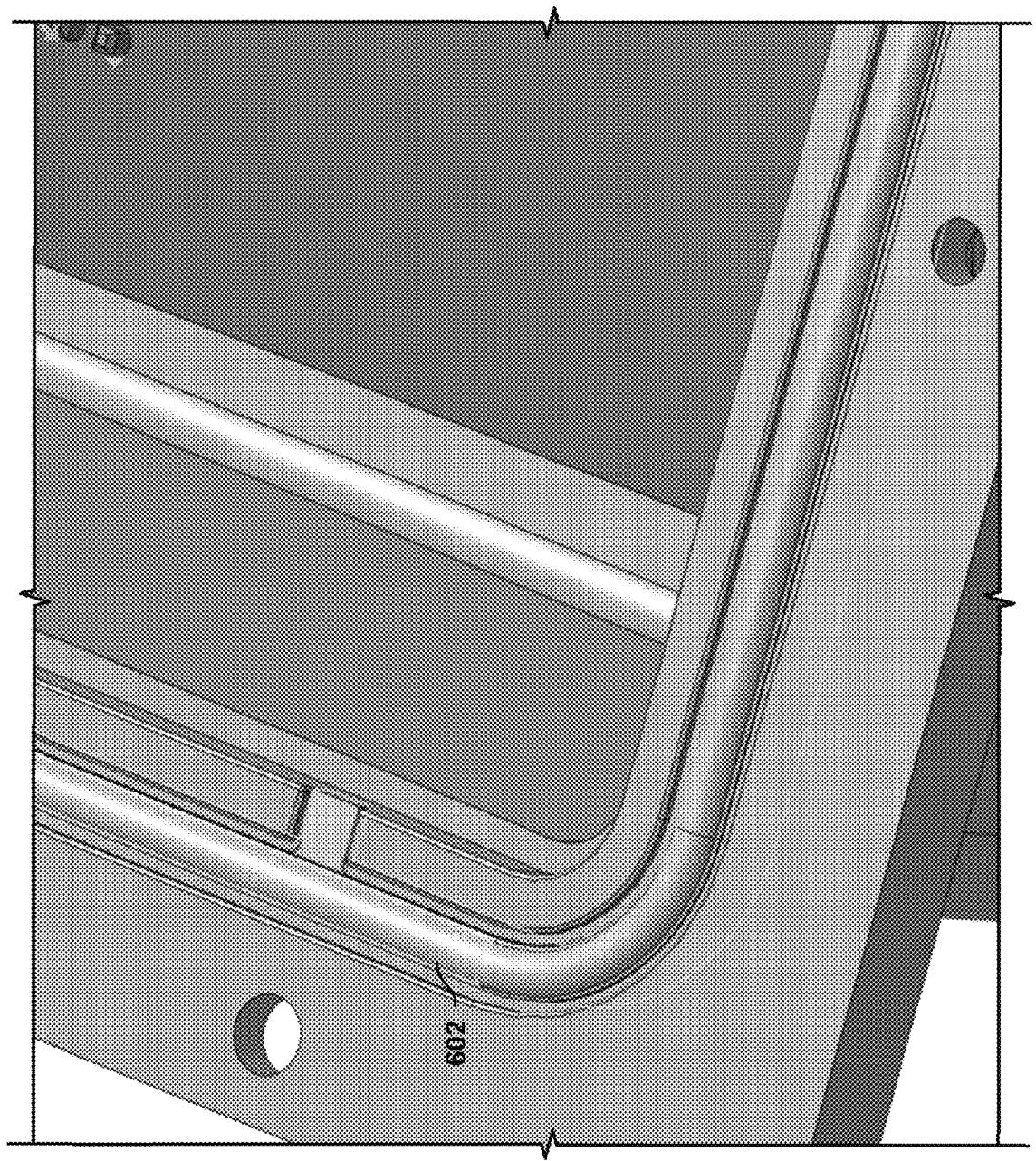
FIG. 6 is a diagram showing a closeup image of a gasket that is disposed in a cover to a power module.

FIG. 6 is a diagram showing a closeup image of a gasket that is disposed in a cover to a power module. As shown in the example of FIG. 6, gasket 602, which lines the edge of the underside of the cover (as shown in FIG. 5), can be made of moldable plastic, such as elastomer. In the example of FIG. 6, gasket 602 sits within a corresponding groove that lines the edge of the underside of the cover. The groove for gasket 602 locks gasket 602 into a consistent position to ensure a tight seal with the surface of a heat sink that is to join with gasket 602.

Figure 7:
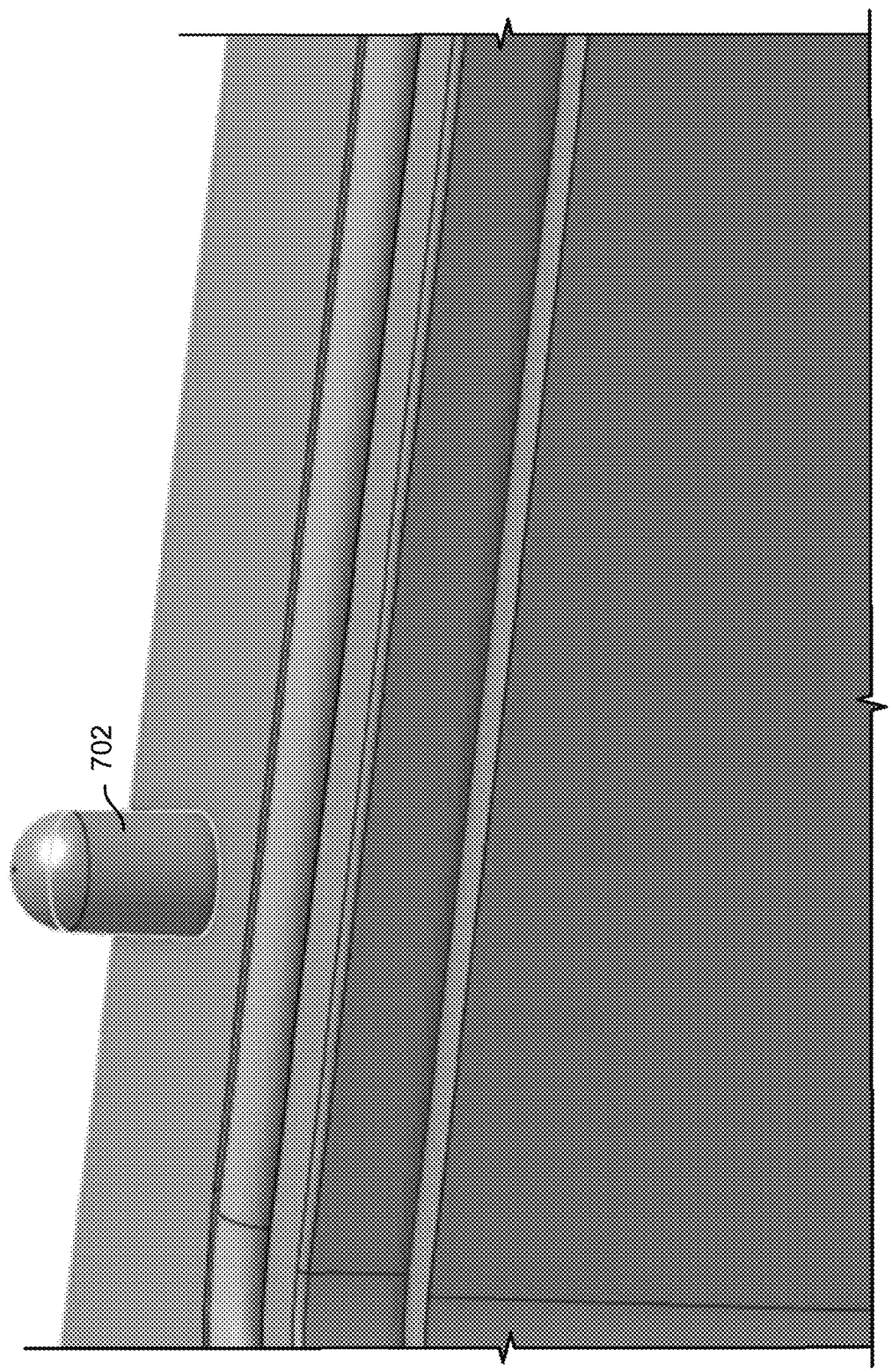
FIG. 7 is a diagram showing a closeup image of an engagement feature that extends out of a cover to a power module.

FIG. 7 is a diagram showing a closeup image of an engagement feature that extends out of a cover to a power module. For example, engagement feature 702 can be a pin that protrudes out of the underside of the cover (as shown in FIG. 5) to engage with a receiving hole on a heat sink to align and join the cover with the heat sink.

Figure 8:
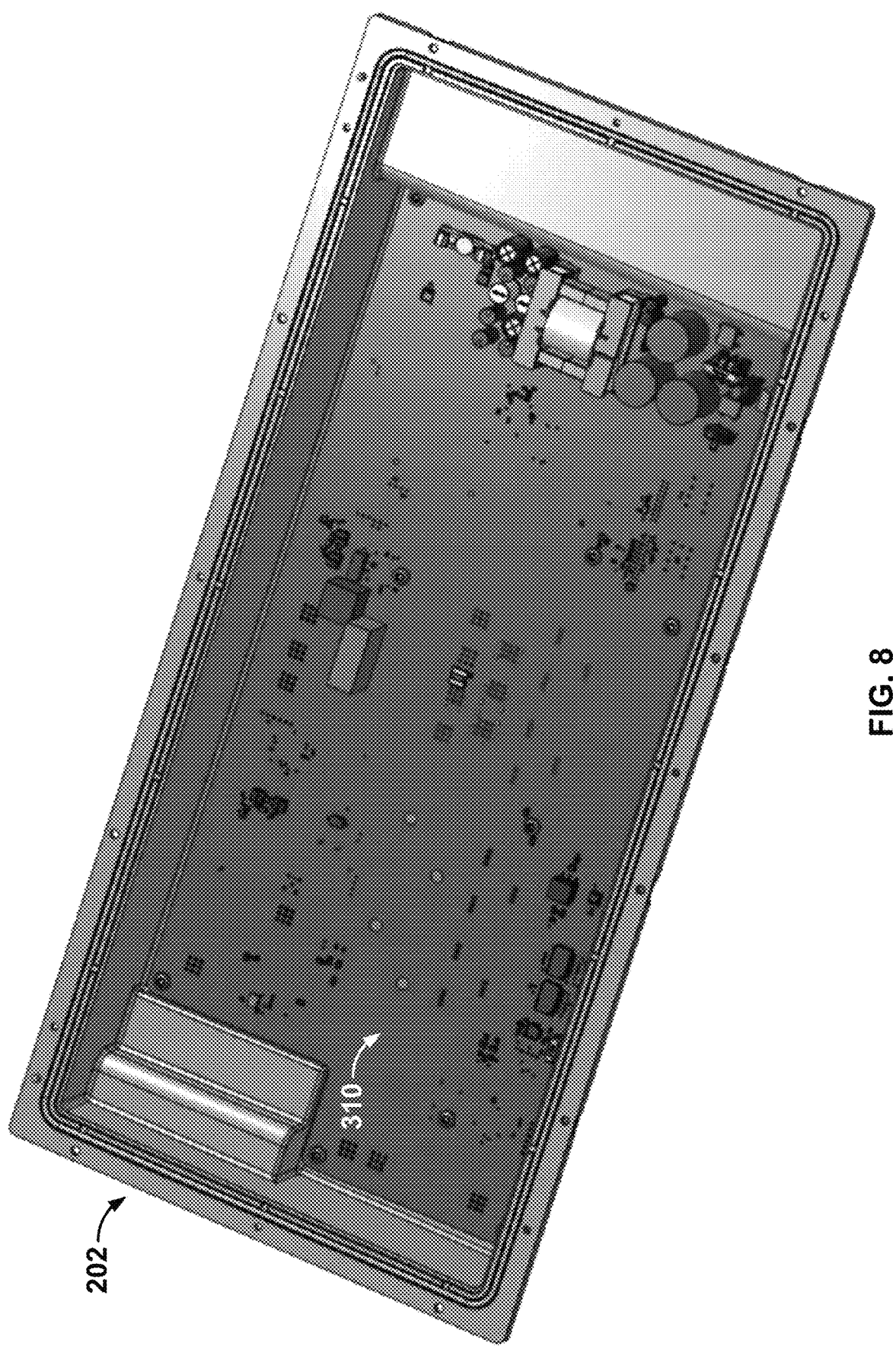
FIG. 8 is a diagram showing an example of a cover to a power module that is fastened to a terminal circuit board.

FIG. 8 is a diagram showing an example of a cover to a power module that is fastened to a terminal circuit board. For example, FIG. 8 shows the underside of cover 202 of FIG. 2 (and as shown in this orientation in FIG. 5) after it has been fastened to terminal circuit board 310 of FIG. 3 using the fasteners that are located only on the underside/internal surface of the cover.

Figure 9:
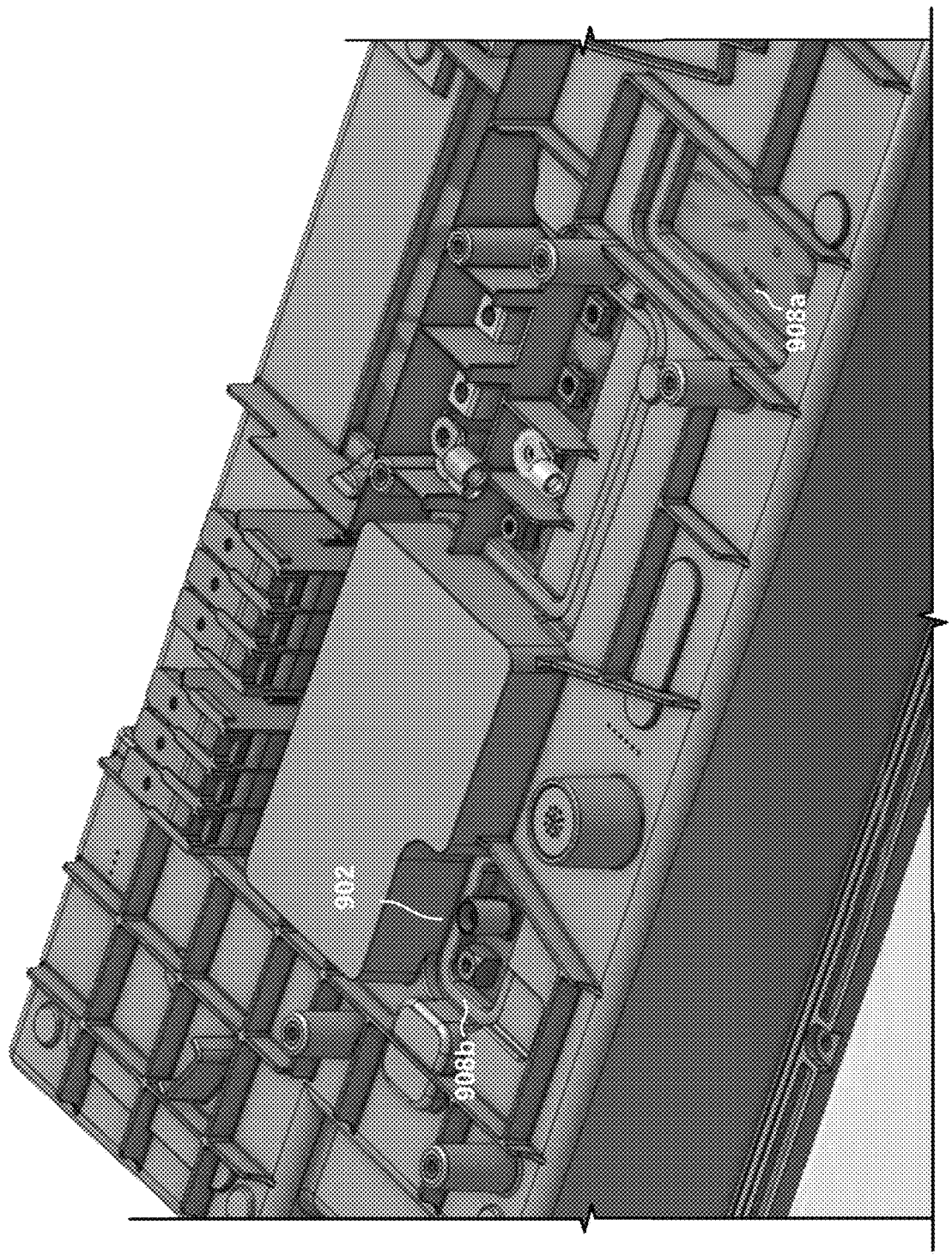
FIG. 9 is a diagram showing an example of the external surface of a cover to a power module and in which the cover selectively exposes regions of the terminal circuit board with which it is fastened on its internal surface.

FIG. 9 is a diagram showing an example of the external surface of a cover to a power module and in which the cover selectively exposes regions of the terminal circuit board with which it is fastened on its internal surface. FIG. 9 shows the combination of the cover and the terminal circuit board in the inverted position as they were shown in FIG. 8. As such, FIG. 9 shows the external surface of the cover which includes cutout regions 908a and 908b that expose the corresponding regions of the terminal circuit board below. As mentioned above, each exposed region of the terminal circuit board is sealed off from the enclosed areas of the terminal circuit board by a corresponding gasket on the internal surface of the cover (e.g., as shown in FIG. 5). The components of the terminal circuit board that are exposed through the cutout regions (e.g., 908a and 908b) of the cover are included in the internal environment of the inverter device and are therefore subject to an environment with an IP rating that is less protective than the IP rating of the sealed off, enclosed environment underneath the cover. Nevertheless, the components of the terminal circuit board that are exposed through the cutout regions (e.g., 908a and 908b) of the cover generally include additional protection (e.g., tin plating) to withstand the less protective environment relative to that of the covered environment and/or need to be exposed so that they can be connected to other components that are outside of the sealed power module. Specific examples of the terminal circuit board that can be exposed through the cutout regions of the cover include one or more of the following: tin-plated connectors, power connectors, a coax cable (902) to connect to an external antenna, data connectors, connectors to the photo-voltaic panels, and metal oxide varistors (that are used to provide surge protection).

Figure 10:
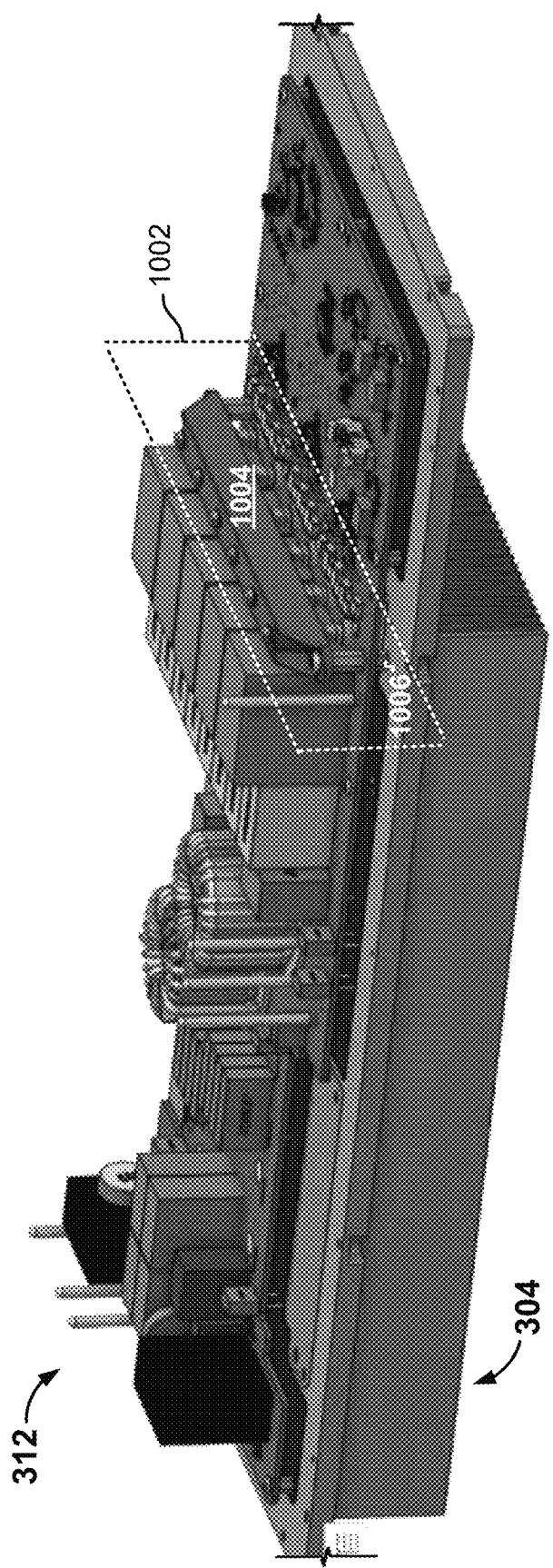
FIG. 10 is a diagram showing an example of a power circuit board that is coupled to a heat sink.

FIG. 10 is a diagram showing an example of a power circuit board that is coupled to a heat sink. In some embodiments, power circuit board 312 of FIG. 3 can be implemented with the example power circuit board of FIG. 10. In some embodiments, heat sink 304 of FIG. 3 can be implemented with the example heat sink of FIG. 10. The example power circuit board of FIG. 10 can be coupled to a terminal circuit board (not shown) (e.g., circuit board 310 of FIG. 3) and also sealed off from the internal environment of an inverter device by a cover (not shown) (e.g., cover 202 of FIG. 2). As mentioned above, the power circuit board in a power module of an inverter device includes electrical components that are configured to convert input DC into AC (and vice versa). These electrical components include switches and inductors that generate significant heat, in particular. As such, the power circuit board is located near a heat sink to allow heat from some of its electrical components to dissipate through the heat sink (which extends out of the enclosed power module) to keep the amount of heat inside the enclosed power module at a safe amount.

In particular, section 1002 of the power circuit board includes gantry 1004 that includes pins that secure switch components (not visible in FIG. 10) against a thermally conductive and electrically insulating material, which is in direct contact with the heat sink. As shown in FIG. 10, gantry 1004 can be directly fastened (e.g., via fastener 1006) into the heat sink at each end via pins that go through the power circuit board. In various embodiments, the switch components of the power circuit board are configured to switch the flow of current and are implemented using transistors. In some embodiments, the transistors comprise metal-oxide-semiconductor field-effect transistors (MOSFETs). When in operation, the transistors can each operate at 600V. The transistors produce heat that is needed to be drawn into and dissipated by the heat sink. As will be described in further detail below, in some embodiments, each transistor includes a metallic plate on its bottom surface that includes an active voltage. The bottom surface of each transistor is not permitted to directly contact the metallic heat sink, which would create an undesirable flow of current. In some embodiments, a thermally conductive and electrically insulating material is added between the metallic plate on the bottom surface of each transistor and the metallic heat sink to aid in the transfer of heat from the transistor to the heat sink in a manner that is also electrically insulating.

Figure 11:
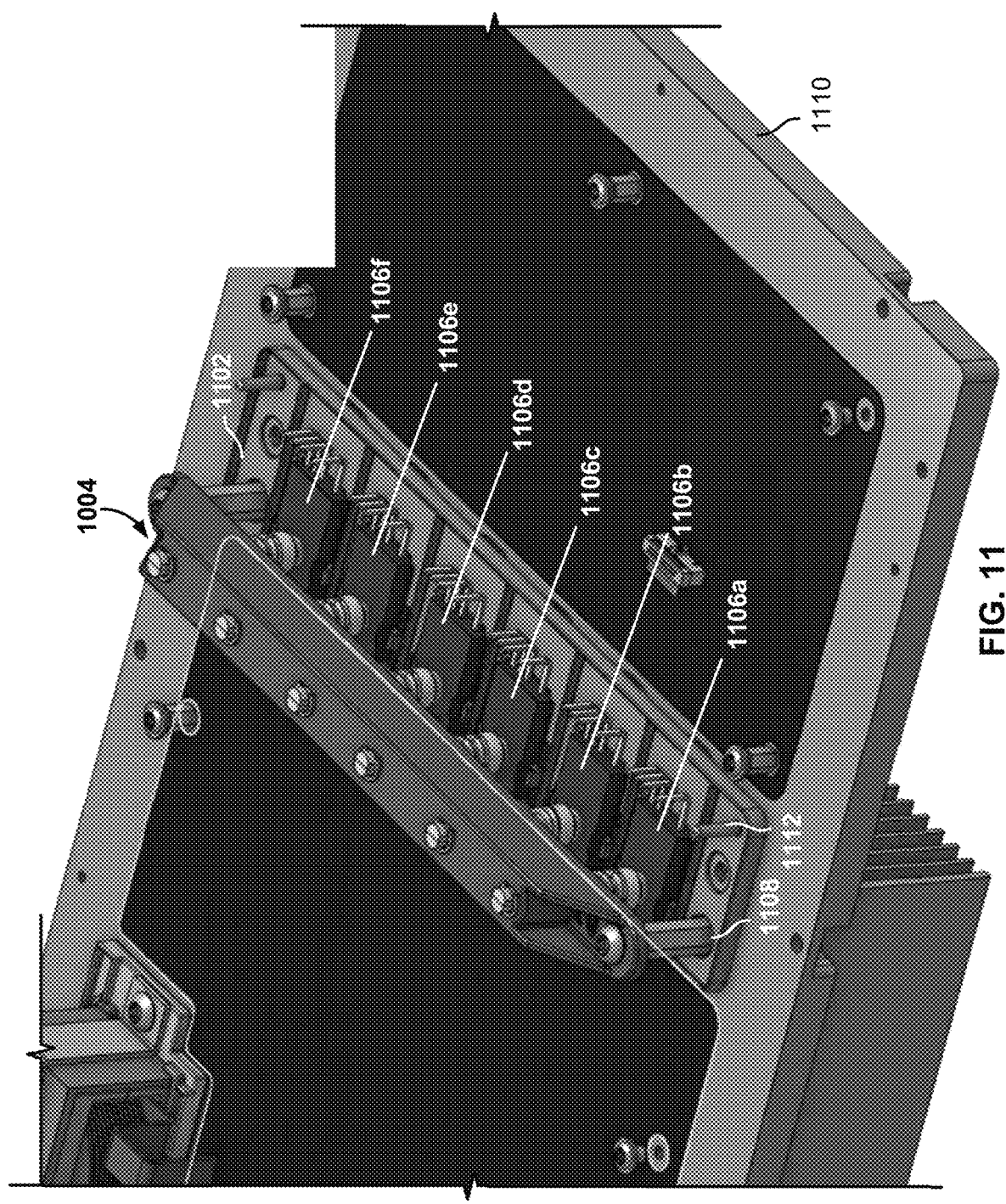
FIG. 11 is a diagram showing a closeup image of a gantry that secures transistors against a thermally conductive and electrically insulating material that is in direct contact (sitting in a cavity of) with a heat sink.

FIG. 11 is a diagram showing a closeup image of a gantry that secures transistors against a thermally conductive and electrically insulating material that is in direct contact (sitting in a cavity of) with a heat sink. In some embodiments, gantry 1004 of FIG. 10 can be implemented with the example gantry of FIG. 11. For illustrative purposes, FIG. 11 shows an example gantry and transistor arrangement but omits the power circuit board (e.g., power circuit board 312 of FIG. 3) that is normally placed between the gantry and transistors 1106a, 1106b, 1106c, 1106d, 1106e, and 1106f (of which only the top surfaces are shown in FIG. 11). Transistors 1106a, 1106b, 1106c, 1106d, 1106e, and 1106f are each locked into a respective static location over heat sink 1110 and a respective location underneath the (not shown) power circuit board by virtue of cassette 1102. Each transistor can be added into cassette 1102 at assembly time via respective snap features of cassette 1102. Cassette 1102 comprises an electrically insulating material (e.g., plastic) and so provides a thermally conductive and electrically insulating material/barrier for the portions (e.g., metallic pins) of each transistor that are in contact with the cassette 1102. Cassette 1102 itself can be fastened into heat sink 1110 by adding pins/fasteners through its receiving holes (e.g., 1108) so that the location of cassette 1102 can also be fixed. Cassette 1102 can also be aligned with the power circuit board (not shown) that is to be placed over it via pins (e.g., pin 1112) that can extend into receiving holes in the circuit board. Put another way, cassette 1102 (which can be cheaply manufactured via injection molding) efficiently secures transistors 1106a, 1106b, 1106c, 1106d, 1106e, and 1106f to their desired locations relative to heat sink 1110 and the power circuit board (not shown). While not shown in FIG. 11, the bottom surface (which is the opposite side of the top surface that is shown in FIG. 11) of each of transistors 1106a, 1106b, 1106c, 1106d, 1106e, and 1106f includes a metallic plate that is exposed through a respective cutout region of cassette 1102 to a thermally conductive and electrically insulating material that is sitting in a cavity of the heat sink, which will be described in further detail below. Because the metallic plate on the bottom surface of each transistor is at a high voltage, if the metallic plate directly engaged heat sink 1110 to transfer heat away from the transistor, then heat sink 1110 would also sit at a voltage potential, which would undesirably lead to requiring the entire heat sink to be isolated. As such, to draw away the heat from each transistor's bottom surface metallic plate to heat sink 1110, a thermally conductive and electrically insulating material is placed directly between cassette 1102 and heat sink 1110. As a result, the metallic plate on the bottom surface of each transistor (from transistors 1106a, 1106b, 1106c, 1106d, 1106e, and 1106f) is exposed to this thermally conductive and electrically insulating material that sits in a corresponding cavity of heat sink 1110 to allow heat from the transistor to be transferred through the thermally conductive and electrically insulating material and into heat sink 1110. Heat sink 1110 then dissipates the heat into the ambient environment across its many surfaces (e.g., over its fins).

Figure 12:
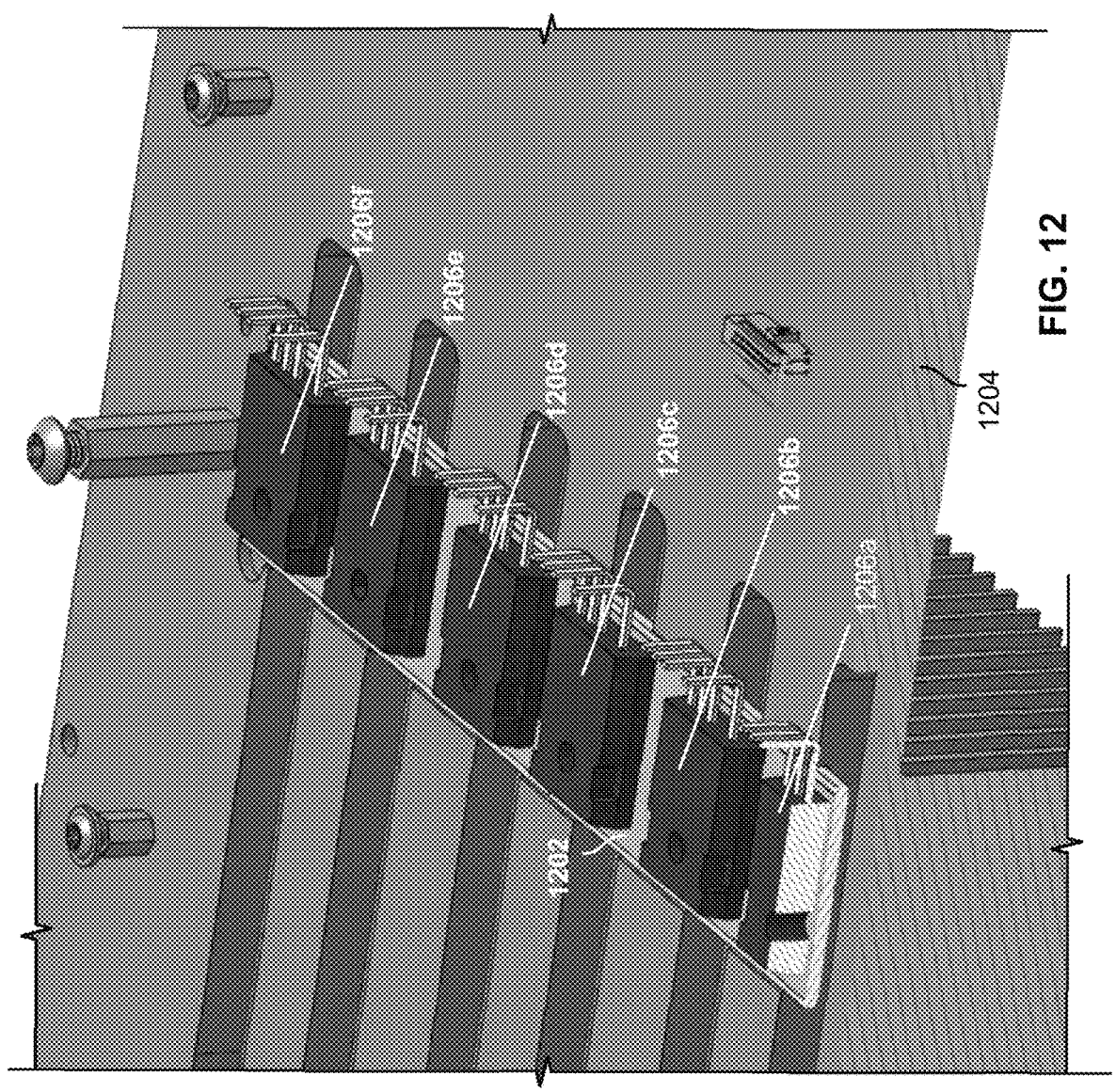
FIG. 12 is a diagram showing an example of a thermally conductive and electrically insulating material that sits between transistors of a power circuit board and a heat sink.

FIG. 12 is a diagram showing an example of a thermally conductive and electrically insulating material that sits between transistors of a power circuit board and a heat sink. Transistors 1206a, 1206b, 1206c, 1206d, 1206e, and 1206f that are part of a power circuit board (e.g., circuit board 312 of FIG. 3) are shown in FIG. 12 without the power circuit board, the cassette (e.g., cassette 1102 of FIG. 1), and the gantry (e.g., gantry 1004 of FIG. 10) to illustrate that despite having their locations becoming fixed by the cassette, the bottom surfaces of the transistors that include metallic plates are exposed out of the cassette and engage directly with thermally conductive and electrically insulating material 1202. As mentioned above, the metallic plates on the back surfaces of the transistors are very hot and sit at a high voltage (e.g., close to 600V) when the transistors are in operation. Therefore, it is desirable to transfer heat from transistors 1206a, 1206b, 1206c, 1206d, 1206e, and 1206f to heat sink 1204 but in a manner that also electrically isolates the transistors from heat sink 1204. By placing thermally conductive and electrically insulating material 1202 directly underneath the exposed metallic plates on the back surfaces of transistors 1206a, 1206b, 1206c, 1206d, 1206e, and 1206f, the heat from the bottom surfaces of the transistors can be transferred to heat sink 1204 via thermally conductive and electrically insulating material 1202, which would also provide a barrier to current flow from the metallic plates to heat sink 1204. As shown in FIG. 12, the area of the top surface of thermally conductive and electrically insulating material 1202 is greater that the collective area of the bottom surfaces of transistors 1206a, 1206b, 1206c, 1206d, 1206e, and 1206f and therefore spreads heat from the transistors over a greater area of heat sink 1204. In some embodiments, thermally conductive and electrically insulating material 1202 conducts heat at greater than 100 W/(meter*K).

Figure 13:
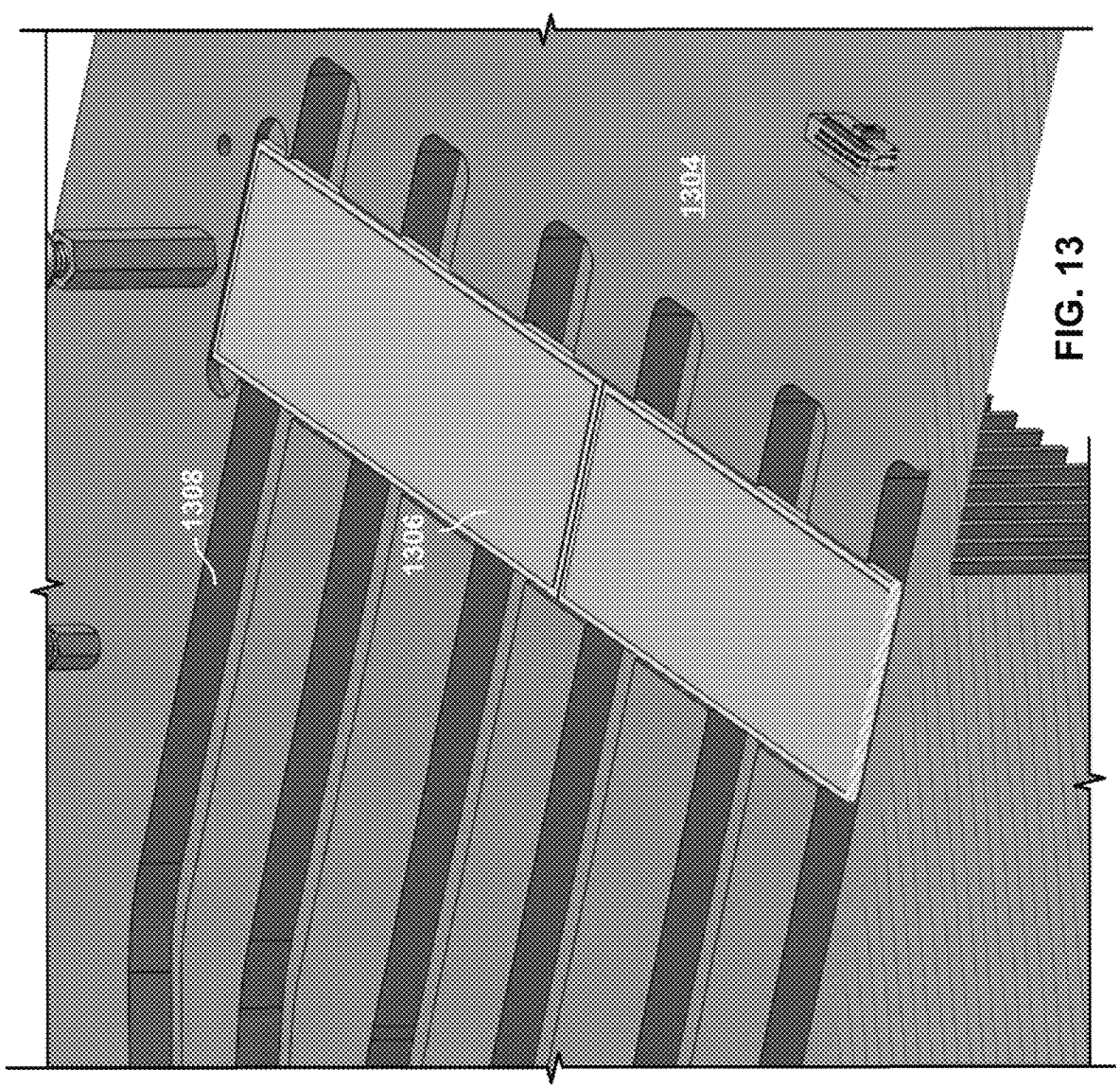
FIG. 13 is a diagram showing an example thermally conductive and electrically insulating material.

FIG. 13 is a diagram showing an example thermally conductive and electrically insulating material. For example, thermally conductive and electrically insulating material 1202 can be implemented using thermally conductive and electrically insulating material 1306 of FIG. 13. As shown in FIG. 13, thermally conductive and electrically insulating material 1306 includes two instances of such material laid out side by side within a corresponding cavity in heat sink 1304. In other examples, thermally conductive and electrically insulating material 1306 can be a single piece of material or more than two pieces of material. The corresponding cavity is of a substantially similar size and dimensions as thermally conductive and electrically insulating material 1306 and is configured to secure thermally conductive and electrically insulating material 1306 in place within heat sink 1304. While not shown in FIG. 13, the cassette (e.g., cassette 1102 of FIG. 11) that holds the transistors in place over thermally conductive and electrically insulating material 1306 is fastened over thermally conductive and electrically insulating material 1306 and therefore keeps it from falling out of the cavity in heat sink 1304. Thermally conductive and electrically insulating material 1306 is configured to transfer/conduct heat from the bottom surfaces of transistors (e.g., transistors 1206a, 1206b, 1206c, 1206d, 1206e, and 1206f of FIG. 12) (not shown) that engage with the top surface of thermally conductive and electrically insulating material 1306. The heat that is drawn from the transistors by thermally conductive and electrically insulating material 1306 is then transferred to heat sink 1304 along the sides of thermally conductive and electrically insulating material 1306 that are surrounded by heat sink 1304. The heat that is drawn from thermally conductive and electrically insulating material 1306 can also be dissipated along heat pipes 1308 of heat sink 1304, which are optionally included in heat sink 1304. In some embodiments, thermally conductive and electrically insulating material 1306 can be made of a thermal interface material (e.g., a thermal paste) and/or a thermally conductive and electrically insulating solid, as will be described in further detail below.

Figure 14:
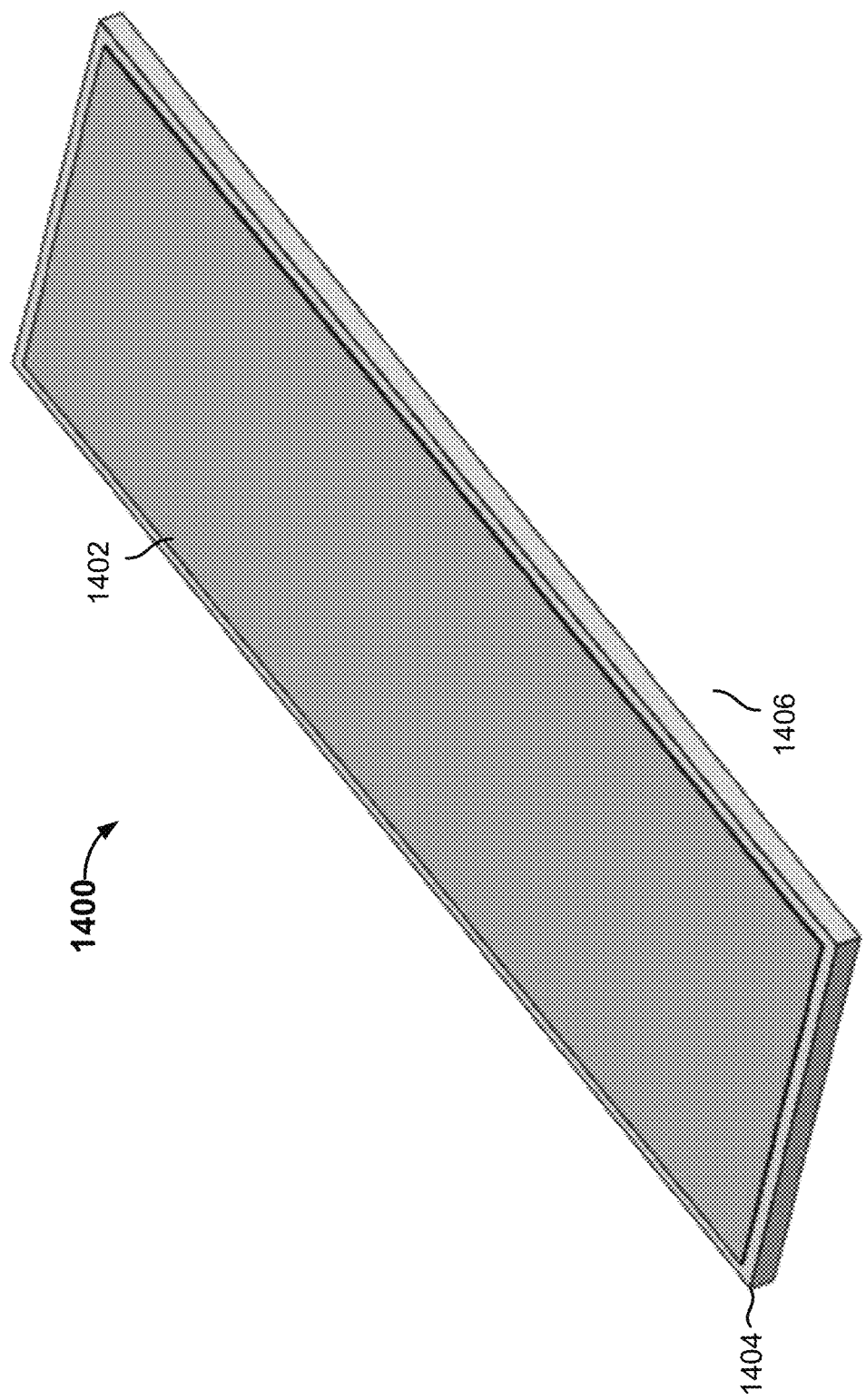
FIG. 14 is an example of a thermally conductive and electrically insulating material.

FIG. 14 is an example of a thermally conductive and electrically insulating material. In some embodiments, thermally conductive and electrically insulating material 1306 of FIG. 13 can be implemented with the one or more instances of the example thermally conductive and electrically insulating material that is described in FIG. 14. The thermally conductive and electrically insulating material of FIG. 14 comprises a sandwich of thermal interface material 1402, thermally conductive solid 1404, and thermal interface material 1406 (not shown). A thermal interface material is inserted between the two components to provide lower thermal impedance/improve the thermal conductivity at the boundary between those two components. As such, thermal interface material 1402, which engages the bottom surface(s) of transistors from the power circuit board and is applied to the top surface of thermally conductive solid 1404, is configured to improve the thermal conductivity between the transistors and thermally conductive solid 1404. Similarly, thermal interface material 1406, which is applied to the bottom surface of thermally conductive solid 1404 and engages with the bottom of the cavity of the heat sink, is configured to improve the thermal conductivity between thermally conductive solid 1406 and the heat sink. Due to having thermal interface material applied to both its top and bottom surfaces that engage the transistors and the heat sink, the sandwiched thermally conductive solid 1406 provides good heat transfer from the transistors to the heat sink. The combination/assembly of thermal interface material 1402, thermally conductive solid 1404, and thermal interface material 1406 is sometimes referred to as a "thermal interface sandwich."

To assemble thermal interface sandwich 1400 (comprising the layers of thermal interface material 1402, thermally conductive solid 1404, and thermal interface material 1406), in some embodiments, each of thermal interface material 1402 and thermal interface material 1406 can be adhered to respective top/bottom surfaces of thermally conductive solid 1404. In some embodiments, while thermal interface material 1402 and thermal interface material 1406 are in the solid state, each of thermal interface material 1402 and thermal interface material 1406 can be silk screened onto the respective top/bottom surfaces of thermally conductive solid 1404. In some embodiments, each of thermal interface material 1402 and thermal interface material 1406 comprises a phase-change material that is applied to thermally conductive solid 1404 at a temperature in which it is still solid and then when the power circuit board is in operation, the heat generated by the transistors will raise the temperature. At around 50 degrees C. or so, the phase-change material will change from a solid into a half liquid that will fill the gaps between the transistors and thermally conductive solid 1404. In some embodiments, thermally conductive solid 1404 comprises aluminum nitride, diamond, or aluminum beryllium oxide. In some embodiments, thermal interface material 1402 and thermal interface material 1406 are applied to thermally conductive solid 1404 during assembly time and the resulting thermal interface sandwich 1400 is dropped into the corresponding cavity in the heat sink.

Figure 15:
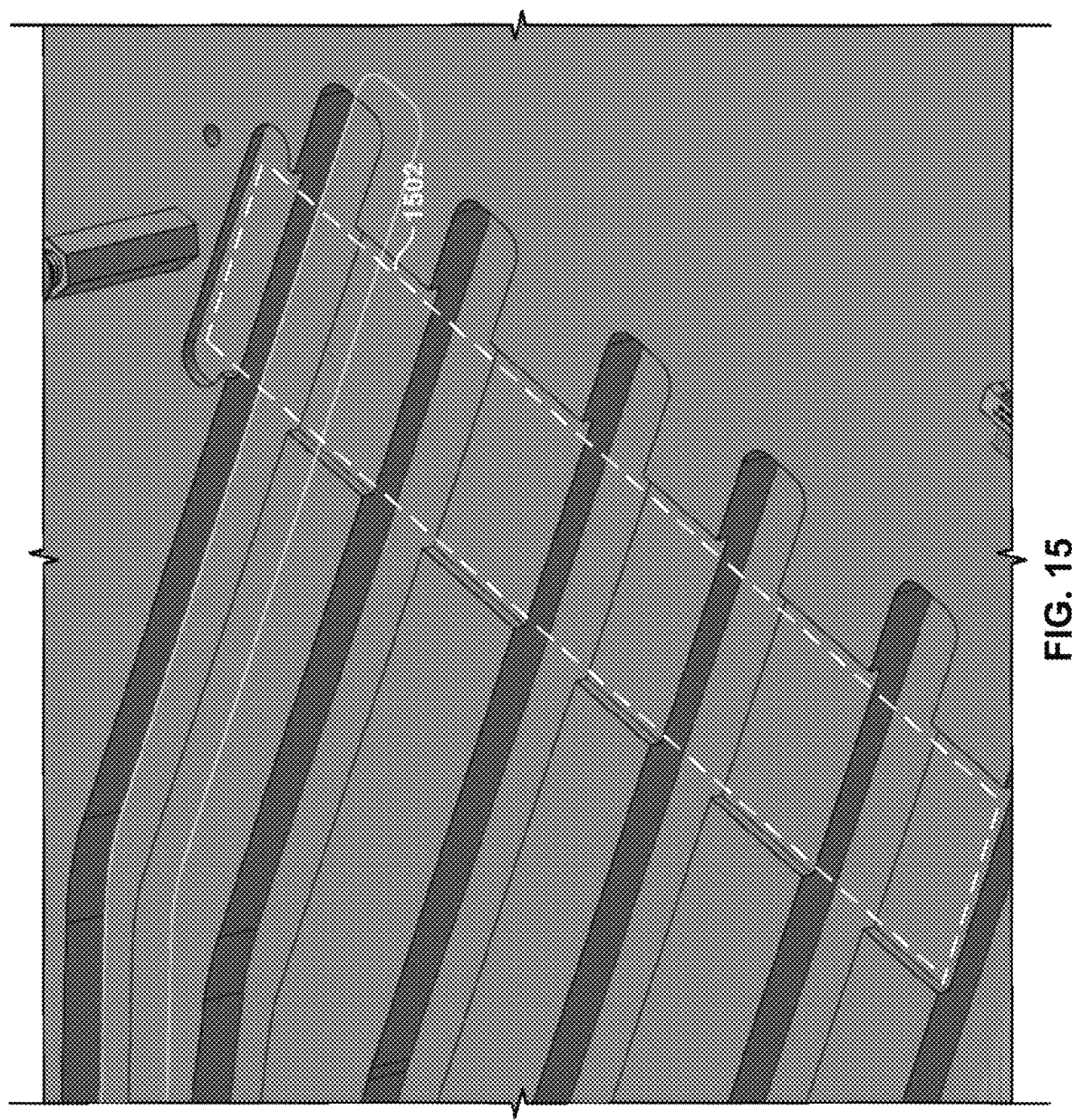
FIG. 15 is a diagram showing an example cavity in a heat sink to place a thermal interface sandwich.

FIG. 15 is a diagram showing an example cavity in a heat sink to place a thermal interface sandwich. A thermal interface sandwich (e.g., thermal interface sandwich 1400 of FIG. 14) can be dropped into cavity 1502, which is set in a heat sink and is of a corresponding size and dimensions of a thermal interface sandwich. Cavity 1502 holds the thermal interface sandwich in place as well as draws heat away from the thermal interface sandwich along each surface of the thermal interface sandwich in which cavity 1502 surrounds the thermal interface sandwich.

Given that the thermal interface sandwich is configured to draw heat away from the bottom surfaces of the transistors on the power circuit board, it is desired to improve the thermal conductivity (by lowering the thermal impedance) between the bottom surface of the transistors and the top thermal interface material layer of the thermal interface sandwich. In various embodiments, a gantry (e.g., gantry 1004 of FIG. 10) that extends out of the heat sink and that includes pins for securing respective transistors against the top thermal interface material layer of the thermal interface sandwich can be used to improve this thermal conductivity, as will be described below.

Figure 16:
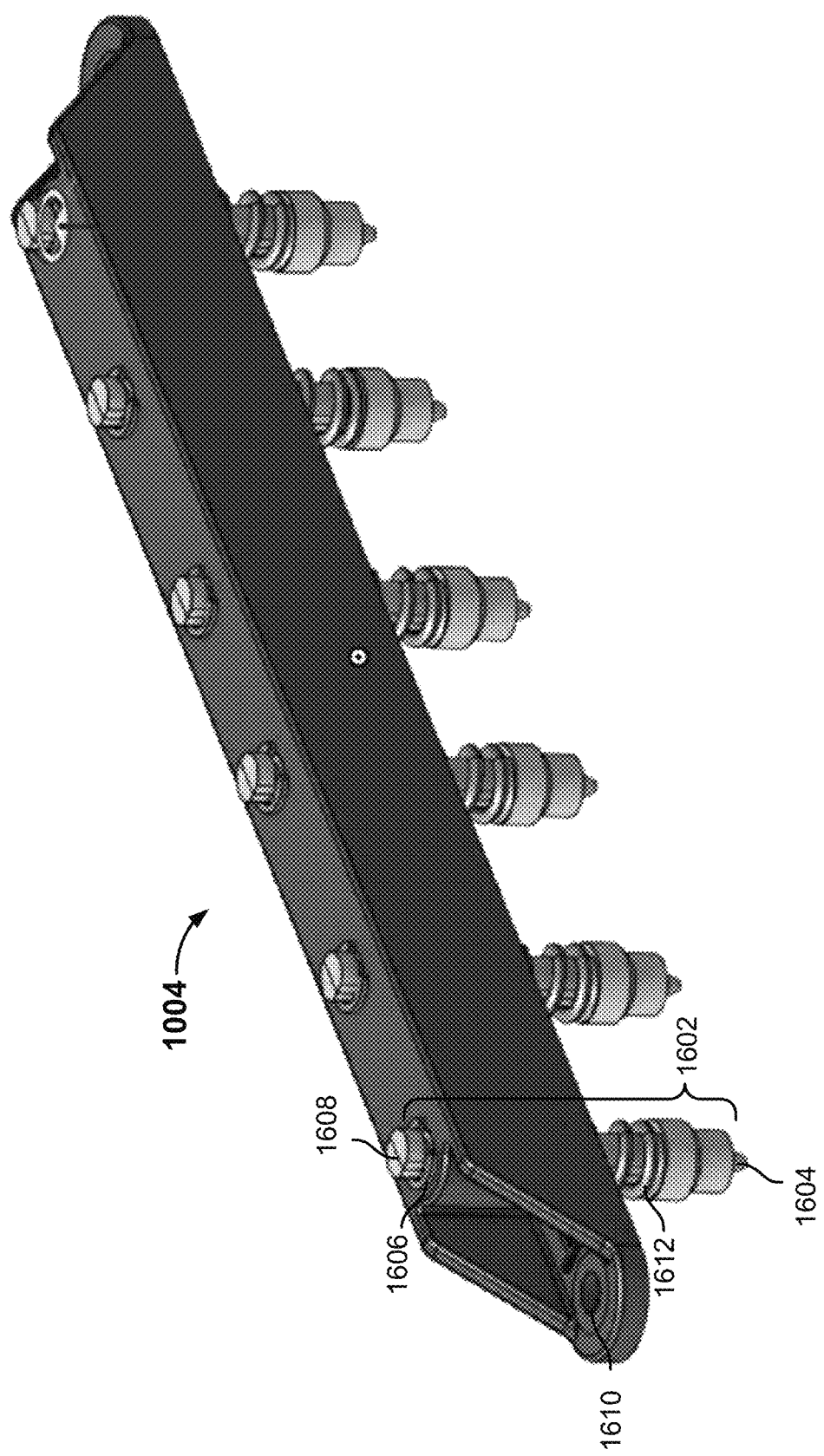
FIG. 16 is a diagram of a closeup image of a gantry.

FIG. 16 is a diagram of a closeup image of a gantry. In some embodiments, gantry 1004 of FIG. 10 can be implemented using the example gantry of FIG. 16. In some embodiments, a gantry that extends out of and is fastened to a heat sink during assembly uses its pins to individually secure each transistor against the thermal interface sandwich that sits in a cavity of the heat sink. One of the purposes of the gantry is to apply a consistent force (e.g., 15 pounds) against the transistors so as to remove air gaps or other causes of thermal impedance between the bottom surfaces of the transistors and the thermal interface sandwich, and to therefore improve the thermal conductivity/transfer of heat from the transistors to the heat sink via the thermal interface sandwich. Referring to FIG. 16, the example gantry assembly includes six pins that extend downwards from the gantry. Each such pin (e.g., pin 1602) is made of an electrically insulating material such as plastic, for example. To illustrate how the gantry assembly is set up during assembly time, metallic spring 1612 is wrapped around pin 1602 and then top 1608 of pin 1602 is inserted through a hole in the gantry as spring 1612 is compressed. To prevent top 1608 of pin 1602 from sliding back through the gantry, retaining ring 1606 is slid over the top of the gantry and below top 1608 as metallic spring 1612 is compressed. Each other pin of the gantry can be inserted into the gantry during assembly time in a similar manner. Once the pins are inserted into the gantry, the pins (such as what is shown in FIG. 16) are inserted through corresponding openings in the power circuit board (e.g., circuit board 312 of FIG. 3) and the tips of the pins (e.g., tip 1604) are placed into the recesses through corresponding transistors that are snapped into the cassette (e.g., cassette 1102 of FIG. 11), which is located underneath the power circuit board. As shown in FIG. 11, which depicts the arrangement of the gantry and pin assembly over the transistors but without the power circuit board that the pins of the gantry would normally insert through, the bottom tip of each pin that extends from the gantry is inserted into a recess of a corresponding transistor. Returning to FIG. 16, the gantry is then fastened into the heat sink via a pin and screw assembly that is inserted through openings on each end of the gantry, such as opening 1610. After the gantry is fastened into the heat sink, the metallic springs that are wrapped around the pins of the gantry assembly become compressed and as a result, exert force against the tips of the pins, which then transfer the force down to the respective transistors with which they are engaged. As such, the spring-loaded pins that extend from the gantry provide a consistent force against the transistors so that any air gaps (which cause thermal impedance) between the bottom surface of the transistors and the thermal interface sandwich are minimized and therefore, the heat transfer from the transistors to the thermal interface sandwich/heat sink combination is improved. For example, the spring-loaded pins can provide 15 pounds of force against the recesses of the transistors. It is advantageous to use springs to provide force on the transistors because springs can compress/absorb shock as needed when materials expand/move as the ambient temperature rises inside the sealed power module from the heat generated by electrical components of the power circuit board. Furthermore, it is advantageous to use metal springs because metal springs do not relax (beyond a given margin) even when the ambient temperature rises.

Figure 17:
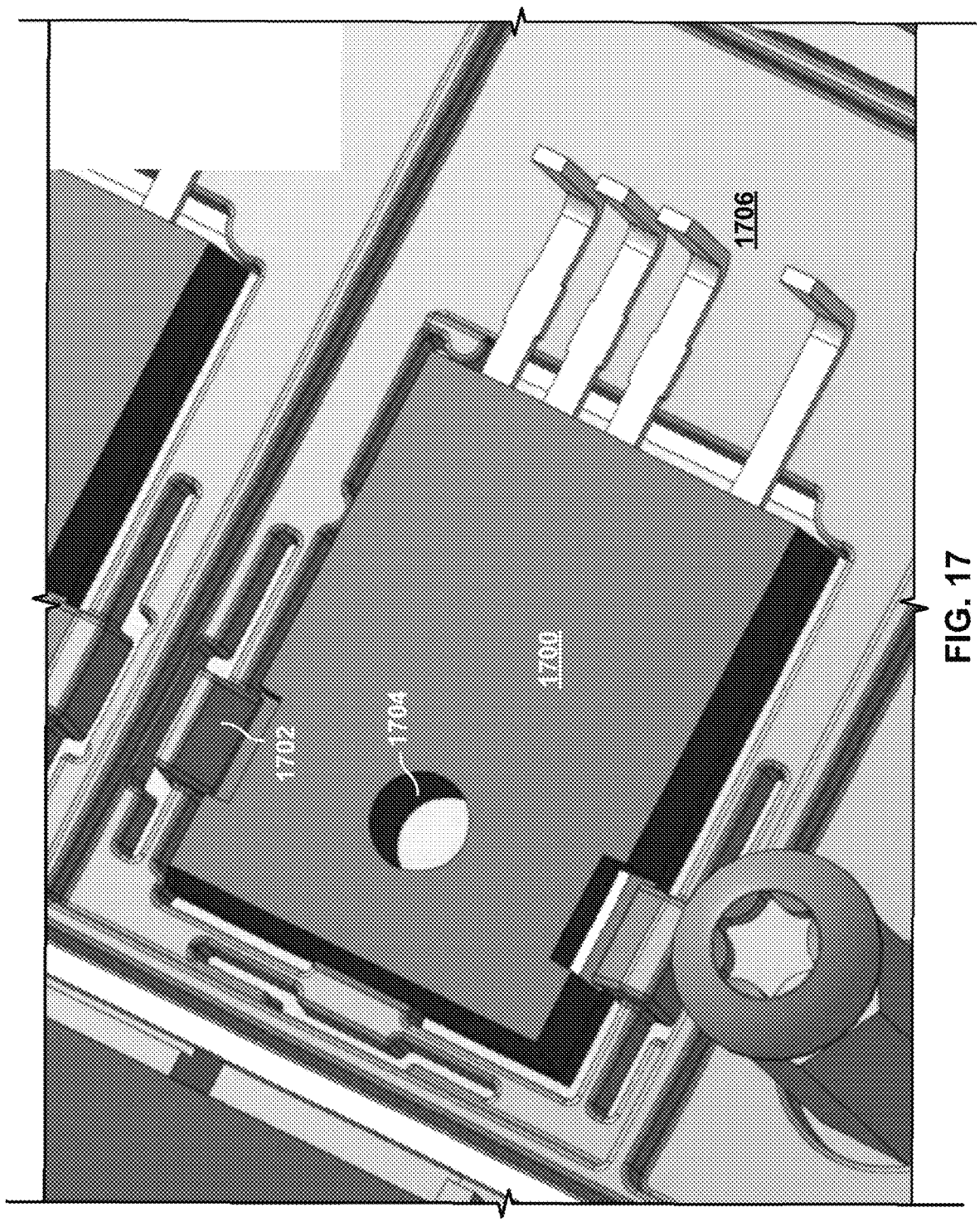
FIG. 17 is a diagram of a closeup of a transistor against which a pin of a gantry assembly is to apply force.

FIG. 17 is a diagram of a closeup of a transistor against which a pin of a gantry assembly is to apply force. Transistor 1700 is locked into a corresponding location on cassette 1706 via snap features (e.g., snap feature 1702). Transistor 1700 also includes recess 1704 (which is shown to be a hole in the example transistor design of FIG. 17) through which the tip of a pin of a gantry assembly can be inserted to engage the pin with the transistor and ensure that the force from the spring-loaded pin is sustained over the transistor. FIG. 17 also shows that cassette 1706 exposes the bottom surface of each transistor to the top thermal interface layer of the thermal interface sandwich that sits beneath cassette 1706.

FIG. 18A is a diagram showing a cross-section of an arrangement of a gantry assembly and transistors before the gantry is fastened into the heat sink. In the example arrangement shown in FIG. 18A, the tips of the pins of the gantry (e.g., gantry 1004 of FIG. 10) have been inserted into the corresponding recesses of the transistors, which are locked into positions via cassette 1810. To better show the relationship between the gantry assembly and the transistors, the power circuit board through which the pins of the gantry are inserted to reach the transistors is omitted in FIG. 18A. As mentioned above, the pins of the gantry are made of electrically insulating material (e.g., plastic) because the tips of the pins are inserted into the recesses of the transistors and are in close proximity to the metal plates on the bottom surfaces of the transistors, which are set at various voltages. In FIG. 18A, the gantry has not yet been fastened into heat sink 1816 at its two ends. Therefore, the spring-loaded pins of the gantry are not yet applying force against the transistors and so gap 1806 exists between the bottom surface of transistor 1814 and the top thermal interface layer of thermal interface sandwich 1804, which is sitting in a corresponding cavity of heat sink 1816. The existence of gap 1806 allows air pockets to exist between the bottom surface of transistor 1814 and the top thermal interface layer of thermal interface sandwich 1804, which increases the thermal impedance between the two components and reduces the efficacy of transferring heat from the bottom surface of transistor 1814 through thermal interface sandwich 1804. Prior to fastening the gantry into heat sink 1816, the tops of the pins are resting on the retaining rings that were slid under the tops while the springs were compressed. When the two ends of the gantry are fastened into heat sink 1816, the gantry is pushed towards heat sink 1816, thereby compressing the springs (e.g., spring 1812) that are wrapped around the portion of the pins (e.g., pin 1802) between the gantry and the tips of the pins. The compressed springs then exert force against the tips of the pins, which in turn, applies a force (e.g., of 15 pounds) against the transistors with which they are engaged. As a result of the force that is applied against the transistors, gap 1806 between the bottom surface of transistor 1814 and the top thermal interface layer of thermal interface sandwich 1804 is substantially eliminated so that the bottom surface of transistor 1814 is substantially flush against the top thermal interface layer of thermal interface sandwich 1804 to improve the thermal conductivity between the two components.

Figure 18B:
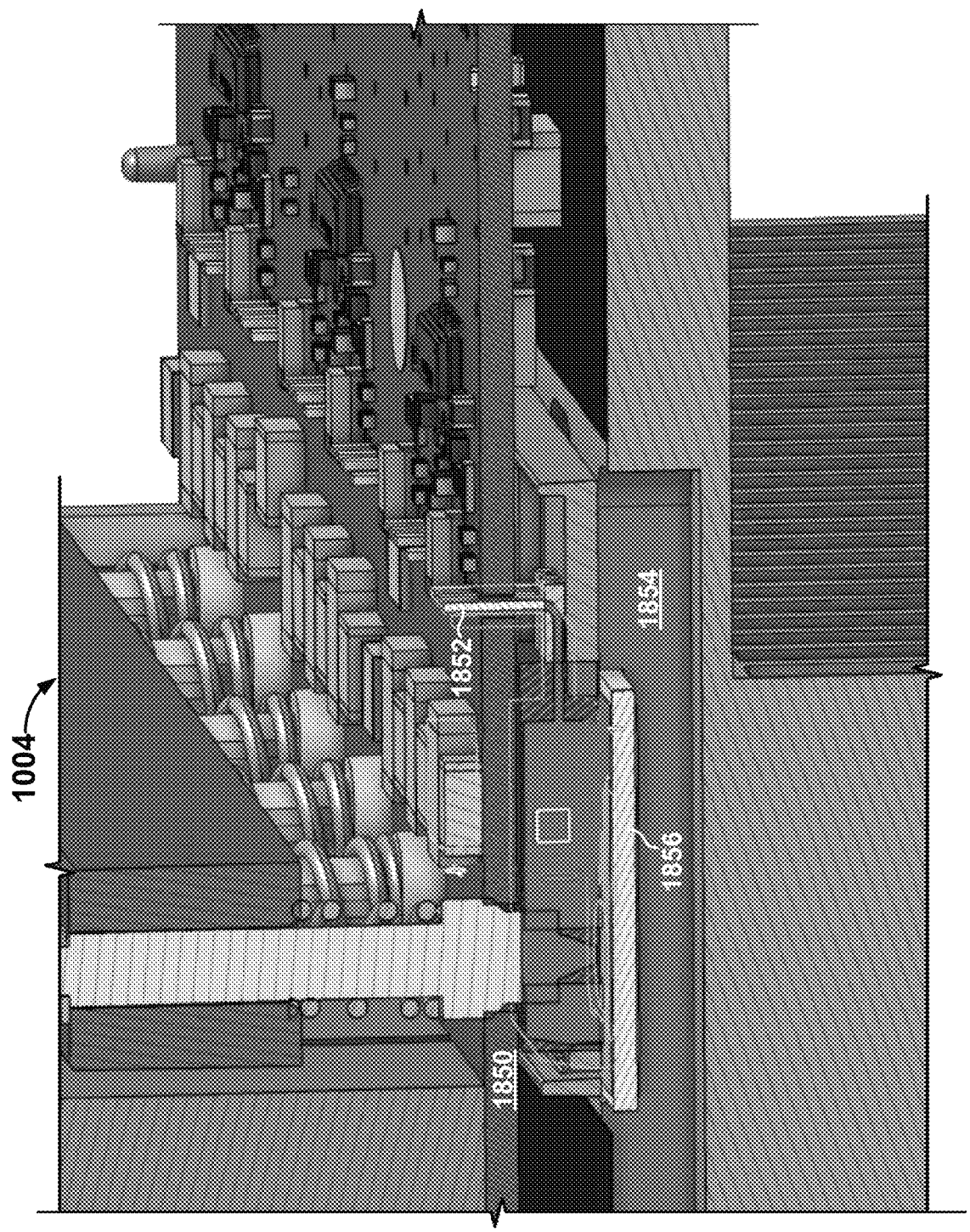
FIG. 18B is a diagram showing a cross-section of an arrangement of a gantry assembly and transistors after the gantry is fastened into the heat sink.

FIG. 18B is a diagram showing a cross-section of an arrangement of a gantry assembly and transistors after the gantry is fastened into the heat sink. In the example arrangement shown in FIG. 18B, the gantry (e.g., gantry 1004 of FIG. 10) has been fastened into heat sink 1854 so that the bottom surfaces of the transistors are flush against the top thermal interface layer of thermal interface sandwich 1856. FIG. 18B further shows power circuit board 1850 through which the pins of the gantry are inserted to reach the transistors below. FIG. 18B further shows the terminals (e.g., gate, body, source, and drain) (e.g., terminals 1852) of each of the MOSFET transistors protruding through power circuit board 1850. The transistor terminals can be soldered onto power circuit board 1850.

Figure 19:
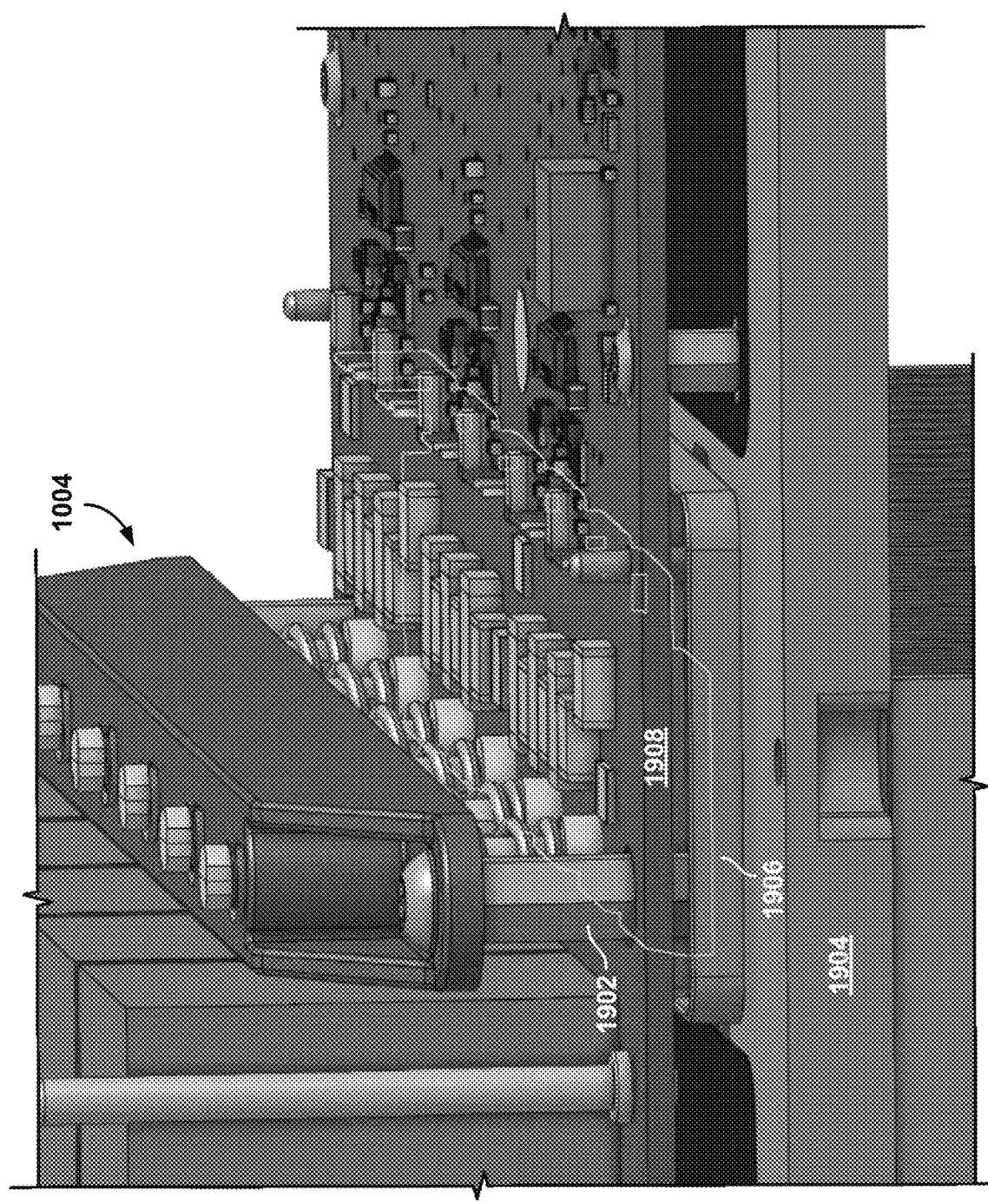
FIG. 19 is a diagram showing an example technique of how one end of a gantry can be fastened into a heat sink.

FIG. 19 is a diagram showing an example technique of how one end of a gantry can be fastened into a heat sink. In the example of FIG. 19, fastener pin 1902 is inserted through a receiving hole through one end of the gantry (e.g., gantry 1004 of FIG. 10), through power circuit board 1908, through cassette 1906, and finally into heat sink 1904. In some embodiments, fastener pin 1902 is secured against the gantry and/or into heat sink 1904 via screws. Another fastener pin similar to fastener pin 1902 can be used on the other end of the gantry to secure the other end of the gantry against the heat sink as well.

Figure 20:
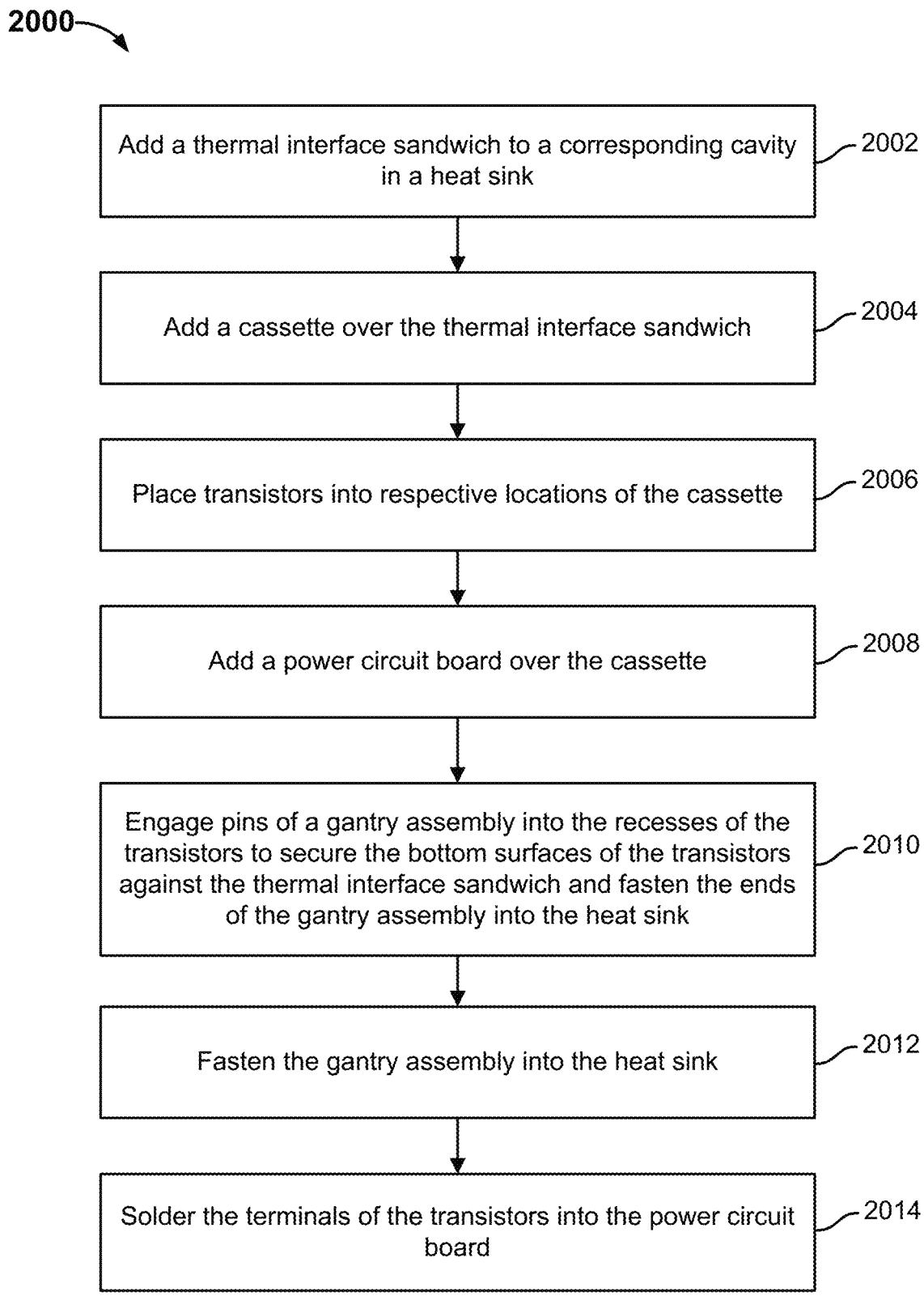
FIG. 20 is a flow diagram showing an example of a process for assembling a gantry to secure transistors against a thermal interface sandwich.

FIG. 20 is a flow diagram showing an example of a process for assembling a gantry to secure transistors against a thermal interface sandwich. In some embodiments, process 2000 can be implemented by an operator to prepare the arrangement of the gantry assembly and transistors that is shown in FIG. 19.

At 2002, a thermal interface sandwich is added to a corresponding cavity in a heat sink. The thermal interface sandwich (e.g., thermal interface sandwich 1400 of FIG. 14), which comprises an assembled top thermal interface layer, a thermally conductive solid layer, and a bottom thermal interface layer, may include one or more pieces, and is dropped into a cavity of a corresponding size and dimensions in a heat sink.

At 2004, a cassette is added over the thermal interface sandwich. The cassette (e.g., cassette 1102 of FIG. 11) that includes snap features to hold each transistor (that is configured to perform switching on the power circuit board) is added over the thermal interface sandwich.

At 2006, transistors are placed into respective locations of the cassette. The transistors are snapped into their respective locations on the cassette. In some embodiments, step 2006 is performed before step 2004.

At 2008, a power circuit board is added over the cassette. The power circuit board (e.g., power circuit board 312 of FIG. 3) is placed over the cassette.

At 2010, pins of a gantry assembly are engaged into the recesses of the transistors to secure the bottom surfaces of the transistors against the thermal interface sandwich and the ends of the gantry assembly are fastened into the heat sink. The gantry (e.g., gantry 1004 of FIG. 10) is placed over the power circuit board and each pin that extends from the gantry is inserted through the power circuit board and into the recess of a corresponding transistor that is locked into place by the cassette.

At 2012, the gantry assembly is fastened into the heat sink. The gantry is secured against the heat sink via pins that are inserted through receiving holes on the ends of the gantry, through the power circuit board, through the cassette, and ultimately into the heat sink.

At 2014, the terminals of the transistors are soldered into the power circuit board. The terminals of the transistors engage with the power circuit board that is placed over the transistors and the terminals can now be soldered onto the board to add the transistors into the circuitry of the power board.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A thermal management system, comprising:
a heat generating component that includes a top surface and a bottom surface;
a heat sink;
a thermally conductive and electrically insulating material that is in direct contact with the heat sink; and
a gantry extending above the heat generating component, wherein the gantry pushes a pin against the top surface of the heat generating component such that the bottom surface of the heat generating component is pushed against the thermally conductive and electrically insulating material, wherein a tip of the pin engages a recess on the top surface of the heat generating component.

2. The thermal management system of claim 1, wherein the heat generating component comprises a transistor.

3. The thermal management system of claim 2, wherein the transistor comprises a metal-oxide-semiconductor field-effect transistor (MOSFET).

4. The thermal management system of claim 1, wherein the heat generating component includes a metallic plate on the bottom surface.

5. The thermal management system of claim 1, wherein the thermally conductive and electrically insulating material is configured to sit in a cavity of the heat sink.

6. The thermal management system of claim 1, wherein the pin extends from the gantry via a spring.

7. The thermal management system of claim 1, wherein the pin is made from an electrically insulating material.

8. The thermal management system of claim 1, wherein the thermally conductive and electrically insulating material comprises at least one of a thermal interface material and a thermally conductive solid.

9. The thermal management system of claim 8, wherein the thermally conductive solid comprises one of aluminum nitride, diamond, and aluminum beryllium oxide.

10. The thermal management system of claim 1, wherein the thermally conductive and electrically insulating material conducts heat at greater than 100 W/(meter*K).

11. The thermal management system of claim 1, wherein the heat generating component is at 600 volts.

12. The thermal management system of claim 1, wherein the heat generating component is coupled to a cassette.

13. The thermal management system of claim 12, wherein the cassette is made of an electrically insulating material.

14. The thermal management system of claim 12, wherein the bottom surface of the heat generating component is exposed to the thermally conductive and electrically insulating material through a cutout in the cassette.

15. The thermal management system of claim 1, wherein the gantry is fastened into the heat sink.

16. The thermal management system of claim 1, wherein the heat sink comprises one or more heat pipes.

17. The thermal management system of claim 1, wherein the heat sink is made of aluminum.

18. The thermal management system of claim 1, wherein the pin extends from the gantry and is inserted through a circuit board that is located between the gantry and the heat generating component.

19. The thermal management system of claim 18, wherein terminals of the heat generating component are soldered onto the circuit board.

20. A thermal management system, comprising:
a heat generating component that includes a top surface and a bottom surface;
a heat sink;
a thermally conductive and electrically insulating material that is in direct contact with the heat sink, wherein the thermally conductive and electrically insulating material comprises at least one of a thermal interface material and a thermally conductive solid, wherein the thermally conductive solid comprises one of aluminum nitride, diamond, and aluminum beryllium oxide; and
a gantry extending above the heat generating component, wherein the gantry pushes a pin against the top surface of the heat generating component such that the bottom surface of the heat generating component is pushed against the thermally conductive and electrically insulating material.

21. A thermal management system, comprising:
a heat generating component that includes a top surface and a bottom surface;
a heat sink;
a thermally conductive and electrically insulating material that is in direct contact with the heat sink, wherein the thermally conductive and electrically insulating material conducts heat at greater than 100 W/(meter*K); and
a gantry extending above the heat generating component, wherein the gantry pushes a pin against the top surface of the heat generating component such that the bottom surface of the heat generating component is pushed against the thermally conductive and electrically insulating material.

22. A thermal management system, comprising:
a heat generating component that includes a top surface and a bottom surface, wherein the heat generating component is at 600 volts;
a heat sink;
a thermally conductive and electrically insulating material that is in direct contact with the heat sink; and
a gantry extending above the heat generating component, wherein the gantry pushes a pin against the top surface of the heat generating component such that the bottom surface of the heat generating component is pushed against the thermally conductive and electrically insulating material.

23. A thermal management system, comprising:
a heat generating component that includes a top surface and a bottom surface, wherein the heat generating component is coupled to a cassette;
a heat sink;
a thermally conductive and electrically insulating material that is in direct contact with the heat sink; and
a gantry extending above the heat generating component, wherein the gantry pushes a pin against the top surface of the heat generating component such that the bottom surface of the heat generating component is pushed against the thermally conductive and electrically insulating material.

* * * * *

UNITED STATES PATENT AND TRADEMARK OFFICE
CERTIFICATE OF CORRECTION

| | | |
|---|---|---|
| PATENT NO. | : 11,849,536 B1 | Page 1 of 1 |
| APPLICATION NO. | : 17/964504 | |
| DATED | : December 19, 2023 | |
| INVENTOR(S) | : Charles Ingalz et al. | |

It is certified that error appears in the above-identified patent and that said Letters Patent is hereby corrected as shown below:

On the Title Page

Column 1, item (72) Inventors, delete "Aaron Nealy", insert --Aaron Neely--, therefor.

Signed and Sealed this
Twenty-seventh Day of May, 2025

Coke Morgan Stewart
*Acting Director of the United States Patent and Trademark Office*